United States Patent
Kanaoka et al.

(10) Patent No.: US 10,423,070 B2
(45) Date of Patent: Sep. 24, 2019

(54) SUBSTRATE TREATING METHOD

(71) Applicant: SCREEN Holdings Co., Ltd., Kyoto (JP)

(72) Inventors: Masashi Kanaoka, Kyoto (JP); Masanori Imamura, Kyoto (JP); Taiji Matsu, Kyoto (JP); Hidetoshi Sagawa, Kyoto (JP); Atsushi Tanaka, Kyoto (JP); Kazuhiro Tadokoro, Kyoto (JP); Kazuya Ono, Kyoto (JP); Shinichi Takada, Kyoto (JP); Tsuyoshi Mitsuhashi, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 0 days.

(21) Appl. No.: 15/445,006

(22) Filed: Feb. 28, 2017

(65) Prior Publication Data
US 2017/0277038 A1 Sep. 28, 2017

(30) Foreign Application Priority Data
Mar. 25, 2016 (JP) .................................. 2016-061858

(51) Int. Cl.
| G03F 7/11 | (2006.01) |
| G03F 7/16 | (2006.01) |
| G03F 7/20 | (2006.01) |
| G03F 7/32 | (2006.01) |

(52) U.S. Cl.
CPC .................. *G03F 7/11* (2013.01); *G03F 7/16* (2013.01); *G03F 7/20* (2013.01); *G03F 7/327* (2013.01)

(58) Field of Classification Search
None
See application file for complete search history.

(56) References Cited

U.S. PATENT DOCUMENTS

| 2007/0190462 A1 | 8/2007 | Shiobara et al. ............. 430/311 |
| 2010/0159372 A1* | 6/2010 | Kanaoka ........... H01L 21/67288 |
| | | 430/30 |

FOREIGN PATENT DOCUMENTS

| JP | H04-275554 | | 10/1992 |
| JP | 2008-251861 A | | 10/2008 |
| JP | 2013-004804 A | | 1/2013 |
| JP | 2014157986 | * | 2/2013 |
| JP | 2014-157986 | | 8/2014 |
| KR | 10-2007-0077107 A | | 7/2007 |
| KR | 10-2016-0023562 | | 3/2016 |

OTHER PUBLICATIONS

Office Action dated Jan. 29, 2018 for corresponding Korean Patent Application No. 10-2017-0033891.
Office Action dated Sep. 18, 2018 for corresponding Korean Patent Application No. 10-2017-0033891.
Notice of Allowance dated Jun. 3, 2019 for corresponding Korean Patent Application No. 10-2017-0033891.

* cited by examiner

*Primary Examiner* — Nathan T Leong
(74) *Attorney, Agent, or Firm* — Ostrolenk Faber LLP

(57) ABSTRACT

A substrate treating method includes a determining step for determining a treating condition for hydrophobizing a surface of a substrate, based on a target regarding a dissolved area size in a resist pattern, and a treating step for hydrophobizing the surface of the substrate with the treating condition determined in the determining step before forming resist film on the surface of the substrate.

15 Claims, 12 Drawing Sheets

SUBSTRATE TREATING METHOD

CROSS-REFERENCE TO RELATED APPLICATIONS

This application claims priority to Japanese Patent Application No. 2016-61858 filed Mar. 25, 2016, the disclosure of which is hereby incorporated herein by reference in its entirety for all purposes.

BACKGROUND OF THE INVENTION (1) Field of the Invention

This invention relates to a substrate treating method for treating substrates. The substrates include semiconductor wafers, glass substrates for photomasks, glass substrates for liquid crystal displays, substrates for optical disks, and so on.

(2) Description of the Related Art

A photolithographic technique is used in a method of forming a resist pattern. The method of forming a resist pattern has a step of hydrophobizing the surface of a substrate, a step of forming resist film on the substrate, a step of exposing the resist film, and a step of developing the exposed resist film, for example. The resist pattern is obtained by developing the resist film.

A resist pattern includes dissolved areas where the resist film has been dissolved, and the non-dissolved areas where the resist film has not been dissolved. The dissolved areas are, for example, spaces, holes, via holes, and through holes. The non-dissolved areas are lines and dots, for example.

The size of a resist pattern generally is dependent on a reticle used in exposure. Japanese Unexamined Patent Publication No. 2014-157986 discloses that the line width of a resist pattern is variable with exposure amount. This publication further discloses that the line width of a resist pattern is variable also with the temperature for post-exposure heating treatment.

SUMMARY OF THE INVENTION

However, the conventional example has the following problem. That is, it may be difficult for the conventional example to improve the dimensional accuracy of a resist pattern.

This invention has been made having regard to the state of the art noted above, and its object is to provide a substrate treating method which can obtain a resist pattern with high dimensional accuracy.

Inventors herein have found that the size of dissolved areas in a resist pattern is variable with treating conditions for hydrophobizing the surfaces of substrates.

The invention has been attained through intensive research based on such findings, and provides the following construction.

A substrate treating method, according to this invention, comprises a determining step for determining a treating condition for hydrophobizing a surface of a substrate, based on a target regarding a dissolved area size in a resist pattern; and a treating step for hydrophobizing the surface of the substrate with the treating condition determined in the determining step before forming resist film on the surface of the substrate.

The substrate treating method according to this invention, with the determining step, can determine a treating condition based on the target. The substrate treating method, with the treating step, can hydrophobize the surface of the substrate with the determined treating condition. When a resist pattern is subsequently formed on the surface of the substrate, the resist pattern obtained has an excellent dimensional accuracy. Specifically, the dimensional accuracy of the dissolved areas included in the resist pattern can be improved. More particularly, the size of the dissolved areas actually obtained can conveniently be approximated to a target dissolved area size. Here, the dissolved areas are areas formed by dissolving the resist film. In other words, the dissolved areas are areas where the resist film has been removed (extracted).

In the above substrate treating method, it is preferred that the treating condition changes a contact angle on the surface of the substrate. In other words, the treating condition, preferably, is a factor that changes the contact angle on the surface of the substrate. The contact angle on the surface of the substrate is variable by the treating condition determined in the determining step. The determining step can therefore conveniently control or regulate the contact angle on the hydrophobized surface of the substrate. Thus, the dimensional accuracy of the dissolved areas can be improved conveniently.

In the above substrate treating method, it is preferred that the target is at least one of a target value of the dissolved area size and an amount of adjustment to a reference value of the dissolved area size. When the target is a target value of the dissolved area size, the determining step can easily determine the treating condition for obtaining the desired dissolved area size. When the target is an amount of adjustment to a reference value of the dissolved area size, the determining step can easily determine the treating condition for regulating the dissolved area size.

In the above substrate treating method, it is preferred that, when the target is a first target, the determining step determines on a first treating condition; and when the target is a second target which provides a larger dissolved area size than the first target, the determining step determines on a second treating condition for providing a larger contact angle on the surface of the substrate than the first treating condition. The larger dissolved area size provided by the target requires the determining step to determine a treating condition for securing the larger contract angle. Therefore, the lager the dissolved area size is provided by the target, the larger the treating step makes the contact angle on the surface of the substrate. This can conveniently improve the dimensional accuracy of the dissolved areas actually obtained.

In the above substrate treating method, it is preferred that the treating condition includes a gas concentration of a treating gas used in the treating step; when the target is a first target, the determining step determines on a first gas concentration; and when the target is a second target which provides a larger dissolved area size than the first target, the determining step determines on a second gas concentration higher than the first gas concentration. The larger dissolved area size the target provides, the higher gas concentration the determining step determines as the treating condition. Consequently, the larger dissolved area size the target provides, the larger the treating step can conveniently make the contact angle on the surface of the substrate.

In the above substrate treating method, it is preferred that the treating condition includes a retention time for keeping a state where the surface of the substrate is covered with a treating gas, without blowing the treating gas out to the substrate; when the target is a first target, the determining step determines on a first retention time; and when the target is a second target which provides a larger dissolved area size than the first target, the determining step determines on a second retention time longer than the first retention time. The larger dissolved area size the target provides, the longer retention time the determining step determines as the treating condition. Consequently, the larger dissolved area size the target provides, the larger the treating step can conveniently make the contact angle on the surface of the substrate.

In the above substrate treating method, it is preferred that the treating condition includes a gas temperature of a treating gas used in the treating step; when the target is a first target, the determining step determines on a first gas temperature; and when the target is a second target which provides a larger dissolved area size than the first target, the determining step determines on a second gas temperature higher than the first gas temperature. The larger dissolved area size the target provides, the higher gas temperature the determining step determines as the treating condition. Consequently, the larger dissolved area size the target provides, the larger the treating step can conveniently make the contact angle on the surface of the substrate.

In the above substrate treating method, it is preferred that the treating condition is at least one of a gas concentration of a treating gas used in the treating step; a gas temperature of the treating gas; a gas flow rate of the treating gas blown out to the substrate; a blowout time for blowing the treating gas out to the substrate; a retention time for keeping a state where the surface of the substrate is covered with the treating gas, without blowing the treating gas out to the substrate; a treating time for hydrophobizing the surface of the substrate; and a temperature of the substrate. This can improve the dimensional accuracy of the dissolved areas included in the resist pattern. Note that the "gas concentration of a treating gas" is, for example, the concentration of a hydrophobizing agent in the treating gas.

In the above substrate treating method, it is preferred that the determining step determines at least two types of the treating condition based on the target. In other words, the determining step preferably determines a first treating condition and a second treating condition different in type from the first treating condition based on the target. Since the determining step can finely determine the treating conditions, it can further improve the dimensional accuracy of the dissolved areas included in the resist pattern.

In the above substrate treating method, it is preferred that the determining step determines the treating condition by referring to pertinent information which provides a relationship between the dissolved area size and the treating condition. The determining step can easily determine the treating condition.

In the above substrate treating method, it is preferred that the pertinent information includes first pertinent information which provides a relationship between the dissolved area size and a contact angle on the surface of the substrate; and second pertinent information which provides a relationship between the contact angle and the treating condition. This facilitates setting of the first pertinent information and second pertinent information.

In the above substrate treating method, it is preferred that the treating condition includes a first treating condition, and a second treating condition; and the pertinent information provides a relationship between the dissolved area size and a combination of the first treating condition and the second treating condition. The determining step can efficiently determine a plurality of treating conditions (e.g. the first treating condition and second treating condition).

In the above substrate treating method, it is preferred that the treating step includes a blowout step for regulating a gas concentration of a treating gas by attenuating the treating gas with an inert gas, and blowing the treating gas having the gas concentration regulated, out to the surface of the substrate; and a retaining step for keeping a state where the surface of the substrate is covered with the treating gas, without blowing the treating gas out to the substrate. The treating step including the blowout step and retaining step can supply the treating gas having the regulated gas concentration to the surface of the substrate. The treating step can therefore conveniently hydrophobize the surface of the substrate.

In the above substrate treating method, it is preferred that the blowout step regulates a gas temperature of the treating gas. The treating step can supply the treating gas having the regulated gas temperature to the surface of the substrate. The treating step can therefore hydrophobize the surface of the substrate with increased effect.

Preferably, the above substrate treating method further comprises a prior blowout step for blowing the treating gas out into a space void of the substrate and discarding the treating gas; wherein the treating condition includes a treating gas condition regarding the treating gas used in the treating step; the prior blowout step being executed when the treating gas condition has been changed in the determining step. The substrate treating method with the prior blowout step can provisionally blow out the treating gas. Further, since the prior blowout step is executed whenever a change occurs to the treating gas condition determined by the determining step, necessary preparations can be made for blowing out the treating gas with the treating gas condition after the change. The treating gas condition includes the concentration, temperature, and flow rate of the treating gas, for example. Therefore, even in the first treating step after a change of the treating gas condition, the treating gas regulated with high accuracy to the treating gas condition after the change can be supplied to the substrate. Consequently, the surface of the substrate can be hydrophobized appropriately, and a lowering of the dimensional accuracy of the resist pattern can be prevented.

In the above substrate treating method, it is preferred that the resist pattern is formed on the resist film which has a large thickness. The size of the dissolved areas included in the resist pattern can be adjusted effectively by changing the treating condition.

Preferably, the above substrate treating method further comprises a resist film forming step for forming the resist film on the surface of the substrate hydrophobized; and a developing step for supplying a developer to the resist film on the surface of the substrate. The substrate treating method with the resist film forming step can conveniently form the resist film on the substrate. The substrate treating method with the developing step can conveniently develop the resist film on the substrate.

In the above substrate treating method, it is preferred that the resist pattern includes at least one of spaces, lines, holes, and dots. The substrate treating method according to this invention is applicable to various resist patterns. The substrate treating method according to this invention can conveniently improve the dimensional accuracy of the resist pattern when the resist pattern includes spaces and lines, or when the resist pattern includes holes, or when the resist pattern includes dots. Note that the holes are also called through holes or via holes.

In the above substrate treating method, it is preferred that the dissolved area size is at least one of a size of spaces, a size of holes, and a size of dots. The substrate treating method according to this invention is applicable to various dissolved area sizes. When, for example, the resist pattern includes spaces and lines and the dissolved areas are the spaces, the substrate treating method according to this invention can conveniently improve the accuracy of the size of the spaces. The size of the spaces is a space width, for example. When, for example, the resist pattern includes holes and the dissolved areas are the holes, the substrate treating method according to this invention can conveniently improve the accuracy of the size of the holes. The size of the holes is a hole diameter, for example. When, for example, the resist pattern includes dots and the dissolved areas are areas other than the dots, the substrate treating method according to this invention can conveniently improve the accuracy of the size of the dots. The size of the dots is a distance between the dots (i.e. a dot pitch), for example.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

DESCRIPTION OF THE PREFERRED EMBODIMENTS

Embodiment 1

Embodiment 1 of this invention will be described hereinafter with reference to the drawings. A substrate treating method according to Embodiment 1 is a method of forming a resist pattern on substrates (e.g. semiconductor wafers).

<Outline Construction of Substrate Treating Apparatus>

An outline construction of a substrate treating apparatus for implementing the substrate treating method according to Embodiment 1 will be described.

Figure 1:
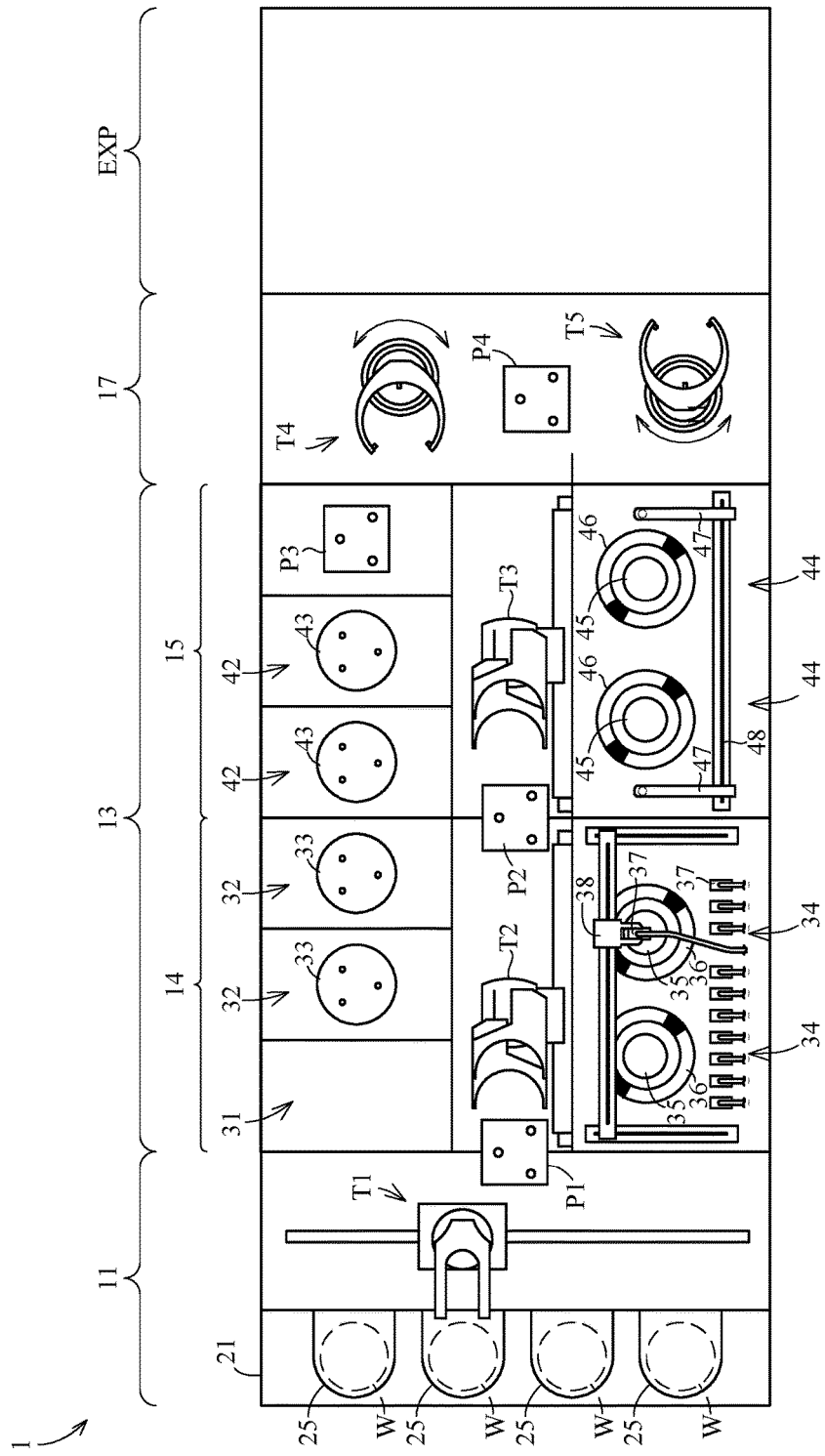
FIG. 1 is a plan view showing an outline construction of a substrate treating apparatus.
Figure 2:
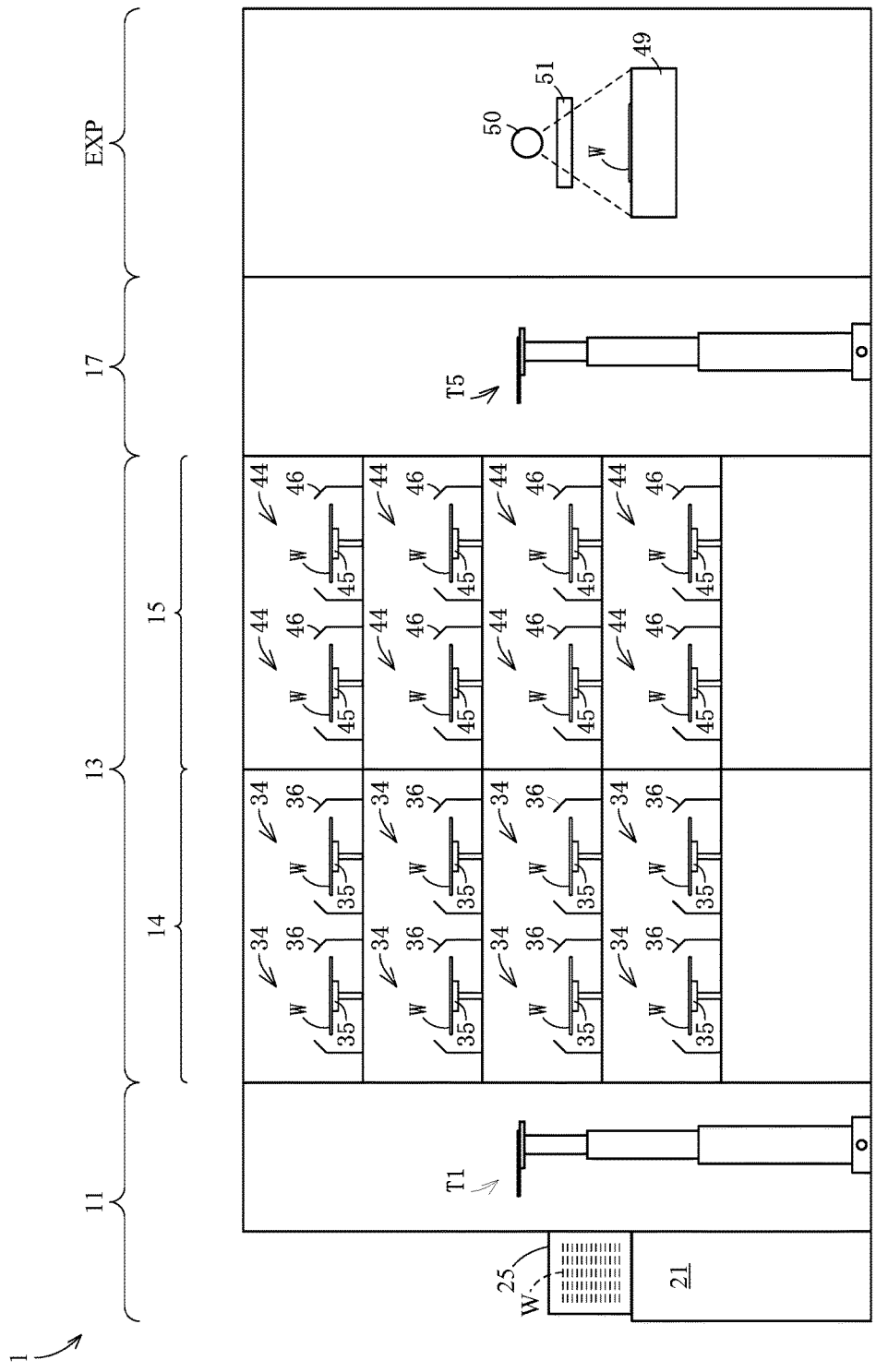
FIG. 2 is a side view showing the outline construction of the substrate treating apparatus.

FIG. 1 is a plan view showing an outline construction of the substrate treating apparatus. FIG. 2 is a side view showing the outline construction of the substrate treating apparatus.

A substrate treating apparatus 1 includes an indexer section (hereinafter referred to as "ID section") 11, a treating section 13, and an interface section (hereinafter referred to as "IF section") 17. The treating section 13 is connected to the ID section 11 and IF section 17, respectively. The IF section 17 further adjoins an exposing machine EXP which is provided separately from the substrate treating apparatus 1.

The ID section 11 has a support table 21. The support table 21 receives a plurality of carriers 25 placed thereon. Each carrier 25 stores a plurality of substrates (e.g. semiconductor wafers) W.

The ID section 11 has a transport mechanism T1. The transport mechanism T1 transports the wafers W. The substrate treating apparatus 1 has a substrate receiver P1 provided between the ID section 11 and treating section 13. The substrate receiver P1 receives the wafers W. The transport mechanism T1 transports the wafers W between the carriers 25 placed on the support table 21 and the substrate receiver P1. Through the substrate receiver P1 the transport mechanism T1 passes the wafers W to the treating section 13, and receives the wafers W from the treating section 13.

The treating section 13 includes a coating block 14 and a developing block 15.

The coating block 14 has a hydrophobizing unit 31 and heat-treating units 32. The hydrophobizing unit 31 hydrophobizes surfaces of the wafers W by supplying a treating gas to the wafers W. The object of hydrophobizing treatment is to improve adhesion between the wafers W and resist film. A specific construction of the hydrophobizing unit 31 will be described hereinafter. The heat-treating units 32 heat-treat the wafers W. Specifically, each heat-treating unit 32 has a heat-treating plate 33. The heat-treating plate 33 heats or cools a wafer W placed on the heat-treating plate 33. The hydrophobizing unit 31 is an example of the treating unit in this invention.

The coating block 14 has coating units 34. The coating units 34 form resist film on the surfaces of wafers W. Specifically, each coating unit 34 has a holder 35, a cup 36, a nozzle 37, and a nozzle transport mechanism 38. The nozzle 37 and nozzle transport mechanism 38 are omitted from FIG. 2. The holder 35 holds a wafer W. The holder 35 is spinnable by a motor not shown. The cup 36 is disposed around the holder 35 for collecting treating liquids scattering from the wafer W. The nozzle 37 dispenses a resist film material. The nozzle transport mechanism 38 transports the nozzle 37 between a position above the wafer W and a nozzle standby position away from above the wafer W. When the holder 35 holds the wafer W, the nozzle 37 dispenses the resist film material to the surface of the wafer W from the position above the wafer W. At this time, the holder 35 may spin the wafer W as appropriate. Consequently, each coating unit 34 applies the resist film material to the surface of the wafer W.

The coating block 14 has a transport mechanism T2. The substrate treating apparatus 1 includes a substrate receiver P2 provided between the coating block 14 and developing block 15. The transport mechanism T2 transports the wafers W between the units 31, 32 and 34, and the substrate receivers P1 and P2. The transport mechanism T2 transfers the wafers W to and from the ID section 11 through the substrate receiver P1. The transport mechanism T2 transfers the wafers W to and from the developing block 15 through the substrate receiver P2.

The developing block 15 has heat-treating units 42. The heat-treating units 42 heat-treat the wafers W. Specifically, each heat-treating unit 42 has a heat-treating plate 43. The heat-treating plate 43 heats or cools a wafer W placed on the heat-treating plate 43.

The developing block 15 has developing units 44. The developing units 44 develop the resist film on the wafers W. Specifically, each developing unit 44 has a holder 45, a cup 46, a nozzle 47, and a nozzle transport mechanism 48. The nozzle 47 and nozzle transport mechanism 48 are omitted from FIG. 2. The holder 45 holds a wafer W. The holder 45 is spinnable by a motor not shown. The cup 46 is disposed around the holder 45 for collecting treating liquids scattering from the wafer W. The nozzle 47 dispenses a developer to the wafer W. Preferably, the developer is water-based. The developer is sodium hydroxide, potassium hydroxide or TMAH (tetramethylammonium hydroxide), for example. The nozzle transport mechanism 48 transports the nozzle 47 between a position above the wafer W and a nozzle standby position away from above the wafer W. When the holder 45 holds the wafer W, the nozzle 47 dispenses the developer to the wafer W from the position above the wafer W. At this time, the holder 45 may spin the wafer W as appropriate. Consequently, each developing unit 44 supplies the developer to the resist film on the wafer W.

The developing block 15 has a transport mechanism T3 and a substrate receiver P3. The transport mechanism T3 transports the wafers W between the units 42 and 44 and the substrate receivers P2 and P3. The transport mechanism T3 transfers the wafers W to and from the IF section 17 through the substrate receiver P3.

The IF section 17 has transport mechanisms T4 and T5 and a substrate receiver P4. The substrate receiver P4 is disposed between the transport mechanisms T4 and T5. The transport mechanism T4 transports the wafers W between the substrate receiver P3 and substrate receiver P4. The transport mechanism T5 transports the wafers W between the substrate receiver P4 and exposing machine EXP. Consequently, the transport mechanisms T4 and T5 transport the wafers W between the developing block 15 and exposing machine EXP. The transport mechanisms T4 and T5 transfer the wafers W between each other using the substrate receiver P4.

The exposing machine EXP exposes the wafers W. The exposing machine EXP has a stage 49, a light source 50, and a reticle (which is also called "photomask") 51. These elements 49-51 are shown in FIG. 2. The stage 49 receives a wafer W. The light source 50 emits light. The reticle 51 is installed between the stage 49 and light source 50. When light transmitted through the reticle 51 reaches the resist film on the wafer W, a pattern provided for the reticle 51 is transferred to the resist film. Consequently, parts of the resist film become dissolvable portions, and the rest of the resist film non-dissolvable portions. The dissolvable portions are dissolvable to the developer, and the non-dissolvable portions not dissolvable to the developer.

<Outline of Substrate Treating Method>

Figure 3:
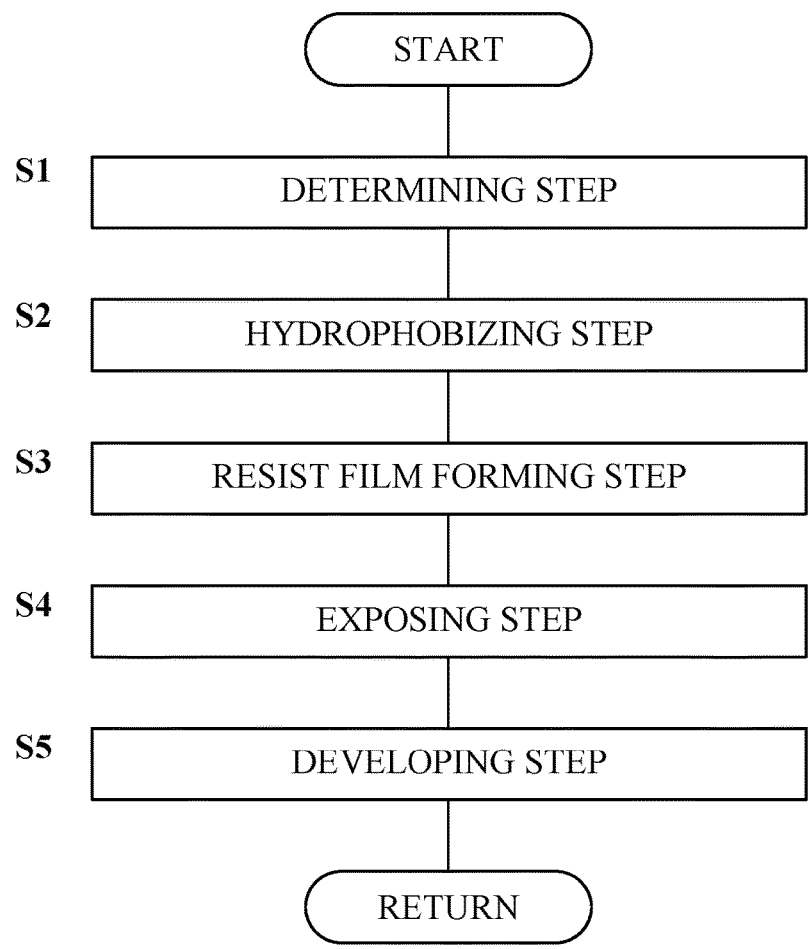
FIG. 3 is a flow chart showing a procedure of a substrate treating method.

An outline of the substrate treating method according to Embodiment 1 will be described. FIG. 3 is a flow chart showing a procedure of the substrate treating method. For expediency of description, steps S2-S5 will be described before step S1 which will be described afterward. FIGS. 4A-4D are sectional view schematically showing a wafer in different steps of the substrate treating method.

The transport mechanism T1 takes a wafer W out of a carrier 25 and places the wafer W on the substrate receiver P1. The transport mechanism T2 transports the wafer W from the substrate receiver P1 to the hydrophobizing unit 31. The hydrophobizing unit 31 hydrophobizes the surface of the wafer W (step S2). The hydrophobizing step is an example of the treating step in this invention.

Figure 4A:
FIGS. 4A-4D are sectional views schematically showing a wafer in different steps of the substrate treating method.

FIG. 4A shows a wafer W having a hydrophobized surface Ws. The surface Ws of the wafer W may be a pattern forming surface. Alternatively, the surface Ws of the wafer W may be a film to be etched. The film to be etched is oxide film or nitride film, for example.

The transport mechanism T2 transports the wafer W from the hydrophobizing unit 31 to one coating unit 34. The coating unit 34 forms resist film on the surface of the wafer W (step S3).

Figure 4B:
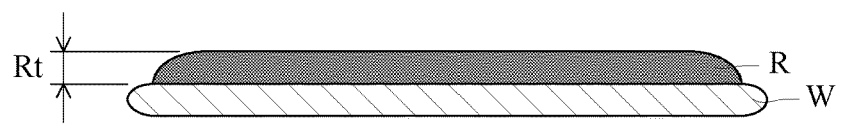

FIG. 4B shows resist film R formed on the wafer W. The resist film R is a thick film. That is, the thickness of resist film R is relatively large. The resist film R has a thickness Rt which desirably is 2 [μm] or more. It is more desirable that the thickness Rt of resist film R is 6 [μm] or more. It is still more desirable that the thickness Rt of resist film R is 8 [μm] or more.

The transport mechanisms T2-T5 transport the wafer W from the coating unit 34 to the exposing machine EXP. Specifically, the transport mechanism T2 transports the wafer W from the coating unit 34 to the substrate receiver P2. The transport mechanism T3 transports the wafer W from the substrate receiver P2 to the substrate receiver P3. The transport mechanism T4 transports the wafer W from the substrate receiver P3 to the substrate receiver P4. The transport mechanism T5 transports the wafer W from the substrate receiver P4 to the exposing machine EXP. The exposing machine EXP exposes the resist film on the wafer W (step S4).

Figure 4C:
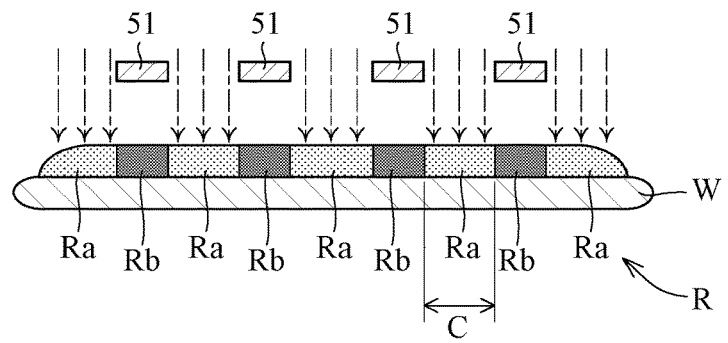

FIG. 4C shows the reticle 51 and exposed resist film R by way of example. FIG. 4C further schematically shows the light having passed through the reticle 51. The resist film R includes dissolvable portions Ra and non-dissolvable portions Rb.

The transport mechanisms T3-T5 transport the wafer W from the exposing machine EXP to one developing unit 44. The developing unit 44 develops the resist film R on the wafer W (step S5). The developing step removes the dissolvable portions Ra.

Figure 4D:
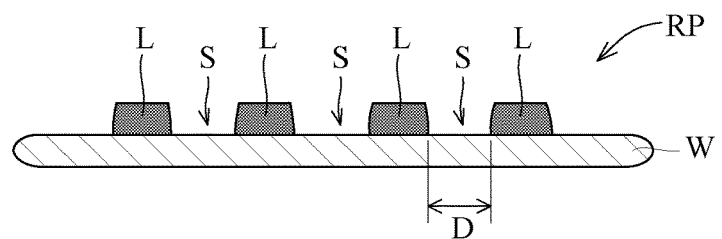

FIG. 4D shows a resist pattern RP obtained after developing the resist film R. The resist pattern RP includes lines L and spaces S. The lines L are the portions of the resist film R not removed in the developing step. The lines L are formed mainly of the non-dissolvable portions Rb. The spaces S are formed by removing the resolvable portions Ra. That is, the spaces S are areas where the resist film R has been removed (extracted). In other words, the spaces S are areas formed by dissolving the resist film R. Each space S is a void (groove) defined by two adjacent lines L and the surface of the wafer W. The spaces S are an example of the dissolved areas in this invention.

The size in the width direction of the dissolvable portions Ra is called "dissolved portion width C" as shown in FIG. 4C. The size in the width direction of the spaces S is called "space width D" as shown in FIG. 4D. More strictly, the dissolved portion width C is a width dimension in a lower part of each dissolvable portion Ra. The space width D is a width dimension in a lower part of each space S. The space width D will never be larger than the dissolved portion width C. That is, an upper limit of the space width D is the dissolved portion width C. The space width D is different from the dimension in the width direction of the lines L (also called the line width). The space width D is an example of the dissolved area size in this invention.

Subsequently, the transport mechanisms T1-T3 transport the wafer W from the developing unit 44 to the carrier 25. In the substrate treating method described above, the wafer W may be transported to the heat-treating units 32 before and after the wafer W is transported to the coating unit 34 to heat-treat the wafer W before and after the resist film forming step. Similarly, the wafer W may be transported to the heat-treating units 42 before and after the wafer W is transported to the developing unit 44 to heat-treat the wafer W before and after the developing step.

A construction and a method for improving the dimensional accuracy of the space width D will be described in detail hereinafter.

<Detailed Construction of Hydrophobizing Unit 31>

Figure 5:
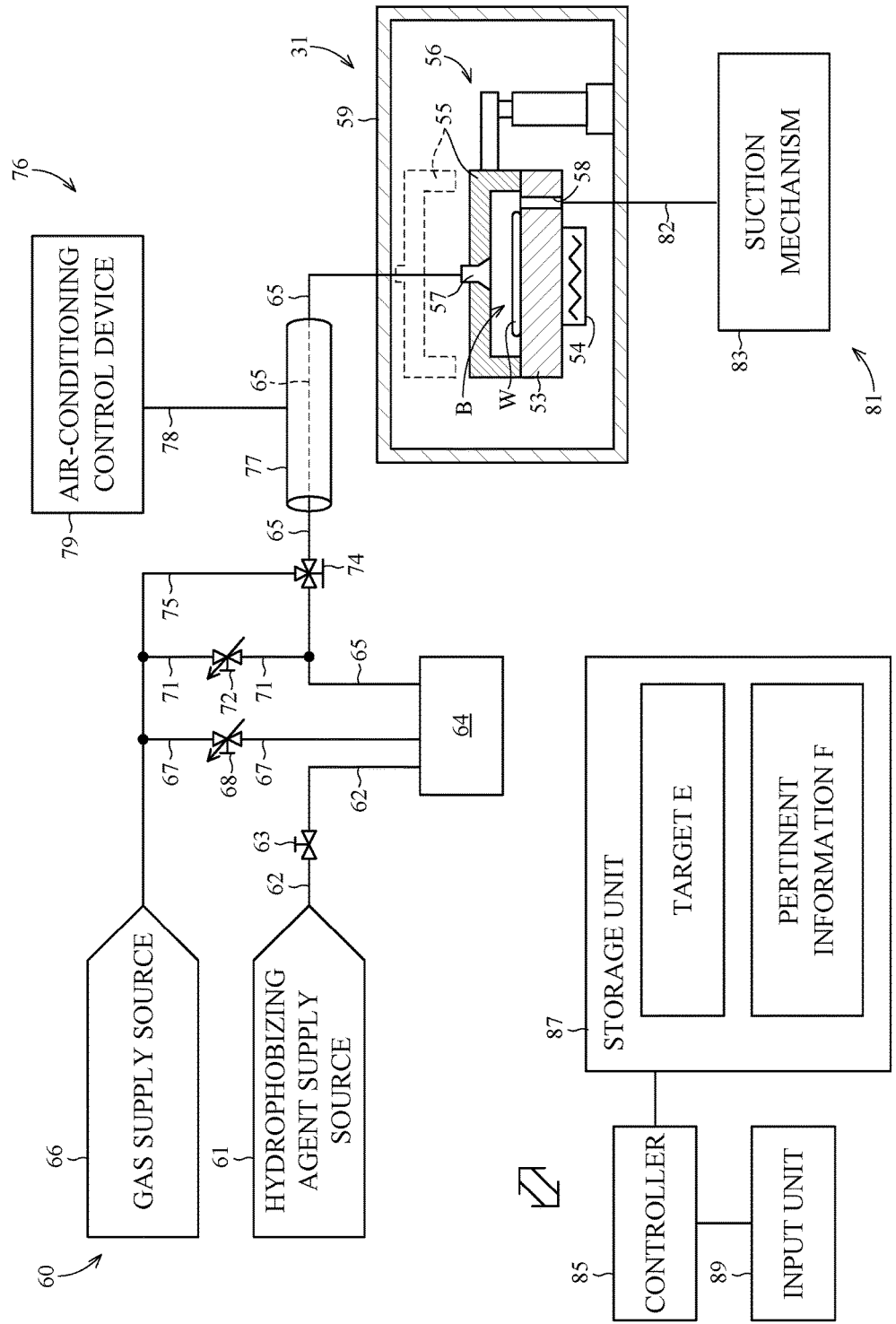
FIG. 5 is a view showing a hydrophobizing unit and components relating thereto.

FIG. 5 is a view showing the hydrophobizing unit and components relating thereto. The hydrophobizing unit 31 has a plate 53, a substrate temperature control element 54, a cover 55, and a lifting and lowering mechanism 56. The plate 53 receives a wafer W. The substrate temperature control element 54 adjusts the temperature of the wafer W placed on the plate 53. The substrate temperature control element 54 is attached to the plate 53, for example. The substrate temperature control element 54 is a heater, for example. The cover 55 is disposed over the plate 53. The lifting and lowering mechanism 56 moves the cover 55 up and down between a lower position and an upper position. In FIG. 5, the solid lines show the cover 55 in the lower position, and the dotted lines show the cover 55 in the upper position. The lifting and lowering mechanism 56 is an air cylinder, for example. When the cover 55 is in the lower position, a space (hereinafter called "treating space) B between the cover 55 and plate 53 is sealed substantially gastight. The wafer W is hydrophobized inside the treating space B. When the cover 55 is in the upper position, the treating space B is opened. When the treating space B is opened, the wafer W can be placed on the plate 53 and can be unloaded from the plate 53.

The hydrophobizing unit 31 has a nozzle 57, an exhaust port 58, and a chamber 59. The nozzle 57 is attached to the cover 55. The nozzle 57 blows the treating gas downward in the cover 55. When the cover 55 is in the lower position, the nozzle 57 blows the treating gas out into the treating space B. The exhaust port 58 is formed in the plate 53. The exhaust port 58 is communication with the treating space B. The gas in the treating space B is discharged outside the treating space B through the exhaust port 58. The chamber 59 houses the elements 53 through 58.

The substrate treating apparatus 1 includes a treating gas supplier 60. The treating gas supplier 60 is connected to the hydrophobizing unit 31. The treating gas supplier 60 supplies the treating gas to the hydrophobizing unit 31.

The treating gas supplier 60 has a hydrophobizing agent supply source 61, piping 62, a switch valve 63, and a vaporizing container 64. The hydrophobizing agent supply source 61 supplies a hydrophobizing agent. The hydrophobizing agent is HMDS (hexamethyldisilazane), for example. The piping 62 connects the hydrophobizing agent supply source 61 and vaporizing container 64. The switch valve 63 is mounted on the piping 62. When the switch valve 63 opens, the hydrophobizing agent is supplied from the hydrophobizing agent supply source 61 to the vaporizing container 64. The vaporizing container 64 vaporizes the hydrophobizing agent, and produces the treating gas including the hydrophobizing agent. The treating gas includes vaporized HMDS (hexamethyldisilazane), for example. The hydrophobizing agent supply source 61 is an example of the treating liquid supply source in this invention. The piping 62 is an example of the treating liquid pipe in this invention.

The treating gas supplier 60 has piping 65. One end of the piping 65 is connected to the hydrophobizing unit 31. More particularly, one end of the piping 65 is inserted into the chamber 59, and connected to the nozzle 57. The other end of the piping 65 is connected to the vaporizing container 64. Thus, the vaporizing container 64 and hydrophobizing unit 31 are connected by the piping 65. The piping 65 supplies the treating gas produced in the vaporizing container 64 to the hydrophobizing unit 31. The piping 65 is an example of the treating gas pipe in this invention.

The treating gas supplier 60 has a gas supply source 66, piping 67, and a flow regulating valve 68. The gas supply source 66 supplies an inert gas. The inert gas is nitrogen gas, for example. One end of the piping 67 is connected to the gas supply source 66. The other end of the piping 67 is connected to the vaporizing container 64. For example, the piping 67 may blow the inert gas out into the treating liquid (i.e. the hydrophobizing agent) in the vaporizing container 64. Or the piping 67 may blow the inert gas out into a gas layer in the vaporizing container 64. Thus, the gas supply source 66 and vaporizing container 64 are connected by the piping 67. The flow regulating valve 68 is mounted on the piping 67. When the flow regulating valve 68 opens, the inert gas is supplied from the gas supply source 66 to the vaporizing container 64. When the inert gas is supplied to the vaporizing container 64, the vaporizing container 64 outputs the treating gas to the piping 65 in the same quantity as the inert gas supplied to the vaporizing container 64. The flow regulating valve 68 is further operable to regulate a flow rate of the inert gas supplied to the vaporizing container 64. Consequently, the flow regulating valve 68 regulates the quantity of treating gas produced in the vaporizing container 64. The piping 67 is an example of the inert gas pipe in this invention.

The treating gas supplier 60 has piping 71 and a flow regulating valve 72. One end of the piping 71 is connected to the gas supply source 66. The other end of the piping 71 is connected to an intermediate part of the piping 65. The flow regulating valve 72 is mounted on the piping 71. When the flow regulating valve 72 opens, the inert gas flows from the gas supply source 66 into the piping 71. The inert gas having flowed into the piping 71 flows into the piping 65 and joins the treating gas outputted from the vaporizing container 64. Consequently, the treating gas outputted from the vaporizing container 64 is attenuated by the inert gas in the piping 65. The flow regulating valve 72 is further operable to regulate a flow rate of the inert gas for attenuating the treating gas outputted from the vaporizing container 64. This regulates the gas concentration of the treating gas.

For example, the higher the flow control valve 72 increases the flow rate of the inert gas for attenuation, the lower becomes the gas concentration of the treating gas. Assume, for example, that the gas concentration of the treating gas produced in the vaporizing container 64 is m [%]. When q1 is the flow rate of the inert gas supplied to the vaporizing container 64 (that is, the flow rate of the treating gas outputted from the vaporizing container 64) and q2 is the flow rate of the inert gas for attenuation, gas concentration G of the treating gas will become $m*q1/(q1+q2)$ [%].

The flow regulating valves 68 and 72 are needle valves or massflow meters, for example. The massflow meters have a further function to detect flow rates.

The treating gas supplier 60 has a three-way valve 74 and piping 75. The three-way valve 74 is mounted on an intermediate part of the piping 65. Preferably, the three-way valve 74 is disposed in a position closer to the hydrophobizing unit 31 than is the position where the piping 65 and piping 71 are connected. The three-way valve 74 has a first inlet port, a second inlet port, and an outlet port. Both the first inlet port and the outlet port are connected to the piping 65. The second inlet port is connected to one end of the piping 75. The other end of the piping 75 is connected to the gas supply source 66. The three-way valve 74 is switchable between a state where the outlet port communicates only with the first inlet port and a state where the outlet port communicates only with the second inlet port. Consequently, the hydrophobizing unit 31 is switchable between a state of being connected to the vaporizing container 64 and a state of being connected to the gas supply source 66. The gas supplied to the hydrophobizing unit 31 is switchable between the treating gas and the inert gas.

The treating gas supplier 60 has a treating gas temperature controller 76. The treating gas temperature controller 76 adjusts temperature of the treating gas.

The treating gas temperature controller 76 has a first outer pipe 77. The first outer pipe 77 is located outside the piping 65 to receive at least part of the piping 65. Preferably, the portion of the piping 65 received in the first outer pipe 77 is a portion close to the hydrophobizing unit 31. The piping 65 and first outer pipe 77 form a double tube construction. A cylindrical space is formed between an inner surface of the first outer pipe 77 and an outer surface of the piping 65.

The treating gas temperature controller 76 has an introduction pipe 78. The introduction pipe 78 is connected to the first outer pipe 77. The introduction pipe 78 supplies a temperature-controlled gas to the cylindrical space formed between the first outer pipe 77 and piping 65. The gas introduced by the introduction pipe 78 is clean air, for example. The gas introduced by the introduction pipe 78 is hereinafter called "temperature control air".

The temperature control air introduced into the first outer pipe 77 flows over the outer surface of the piping 65. That is, the outer surface of the piping 65 is exposed to the temperature control air. The temperature control air regulates the temperature of the piping 65 itself, and regulates the temperature of the treating gas/inert gas flowing through the piping 65.

The treating gas temperature controller 76 has an air-conditioning control device 79. The air-conditioning control device 79 produces the temperature control air at an arbitrary temperature. The air-conditioning control device 79 is connected to the introduction pipe 78. The air-conditioning control device 79 supplies the temperature control air to the introduction pipe 78.

The substrate treating apparatus 1 includes a treating gas exhaust device 81. The treating gas exhaust device 81 is connected to the hydrophobizing unit 31. The treating gas exhaust device 81 discharges gas from the treating space B of the hydrophobizing unit 31.

The treating gas exhaust device 81 has piping 82 and a suction mechanism 83. One end of the piping 82 is inserted into the chamber 59, and is connected to the exhaust port 58. The other end of the piping 82 is connected to the suction mechanism 83. The suction mechanism 83 is a pump or aspirator, for example. When the suction mechanism 83 sucks gas, the gas in the treating space B is discharged outside the treating space B through the exhaust port 58.

The substrate treating apparatus 1 includes a controller 85, a storage unit 87, and an input unit 89.

The controller 85 controls the substrate temperature control element 54, lifting and lowering mechanism 56, switch valve 63, flow regulating valves 68 and 72, three-way valve 74, air-conditioning control device 79, and suction mechanism 83. The controller 85 is realized by a central processing unit (CPU) which performs various processes, a RAM (Random-Access Memory) serving as working space for arithmetic processing, and a storage medium such as a fixed disk.

The storage unit 87 is connected to the controller 85 for communication therewith. The storage unit 87 stores target E and pertinent information F.

The target E relates to the space width D. More strictly, the target E is information which provides a target relating to the space width D. The target E is a target value of the space width D, for example. The pertinent information F provides a relationship between the space width D and treating conditions. The treating conditions are those for hydrophobization of the surfaces of wafers W. Specifically, the pertinent information F provides a relationship between each treating condition and a space width D estimated to be obtained on an assumption that the surfaces of wafers W are hydrophobized on that treating condition.

Figure 6:
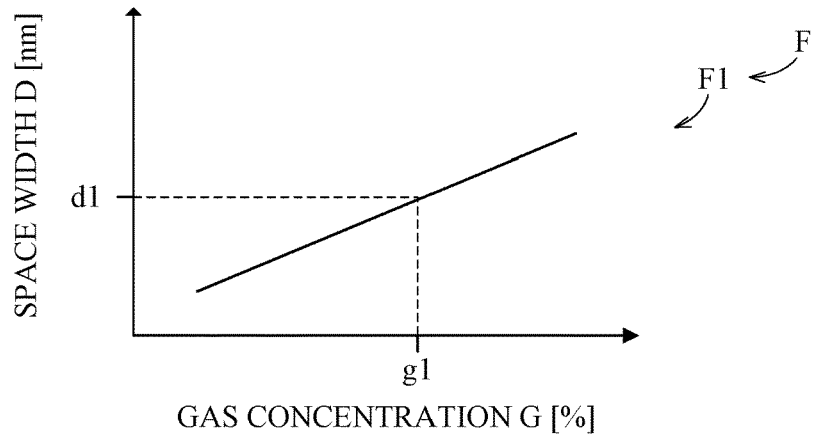
FIG. 6 is a view schematically showing pertinent information.

Reference is made to FIG. 6. The pertinent information F includes pertinent information F1 illustrated in FIG. 6. The pertinent information F1 provides a relationship between gas concentration G of the treating gas and the space width D. More particularly, the pertinent information F1 provides such a relationship that the space width D increases with the gas concentration G of the treating gas. The gas concentration G is a ratio of a volume of the vaporized hydrophobizing agent included in the treating gas to a volume of the treating gas, for example.

The gas concentration G is a treating condition which influences a contact angle on the surface of the wafer W. More particularly, the higher is the gas concentration G used in hydrophobizing the surface of the wafer W, the larger is the contact angle on the surface of the wafer W. In a strict sense, the contact angle is a contact angle of water on the surface of the wafer W. The contact angle is an index indicating a hydrophobic degree of the surface of the wafer W. In this specification, a large contact angle is synonymous with a high degree of hydrophobicity. The gas concentration G is an example of the treating condition in this invention.

The target E and pertinent information F are set by experiment or simulation. The target E and pertinent information F are stored in the storage unit 87 before executing the substrate treating method according to this embodiment. The pertinent information F may be a table in which the space width D and the treating condition are matched. Alternatively, the pertinent information F may be functions of the space width D and treating condition.

The storage unit 87 further stores a variety of information such as a treating recipe (treating program) for treating wafers W.

The input unit 89 is connected to the controller 85 for communication therewith. The input unit 89 is operated by the user. The input unit 89 receives various types of information. The information received by the input unit 89 is target E, for example. The information received by the input unit 89 is commands for selecting and determining specific targets E, for example.

<Details of Substrate Treating Method>

Figure 7:
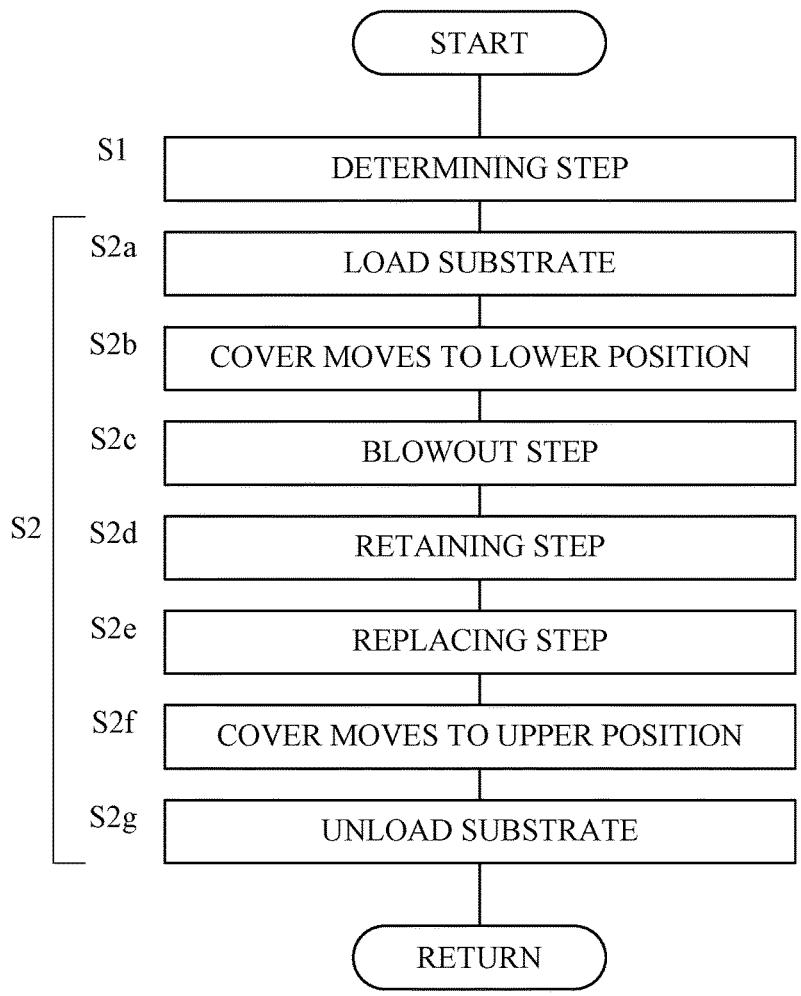
FIG. 7 is a flow chart showing a procedure of the substrate treating method.

FIG. 7 is a flow chart showing details of the procedure of steps S1 and S2 shown in FIG. 3. The entirety of steps S2a-S2g shown in FIG. 7 corresponds to step S2 (hydrophobizing step) shown in FIG. 3.

<Step S1> Determining Step

The controller 85 determines the gas concentration G based on the target E and pertinent information F1. At this time the controller 85 may acquire the target E from the storage unit 87, or may acquire the target E from the input unit 89. Or the controller 85 may identify the target E based on the information stored in the storage unit 87 or the information inputted to the input unit 89. Further, the controller 85 acquires the pertinent information F1 from the storage unit 87.

Reference is made to FIG. 6. When, for example, the target E (specifically, the target value of the space width D) is value d1, the controller 85 determines a target value of the gas concentration G to be value g1.

<Step S2a> Load Wafer W

The cover 55 is in the upper position. A substrate transport mechanism, not shown, places a wafer W on the plate 53. The controller 85 controls the substrate temperature control element 54 to adjust the wafer W to a predetermined temperature.

<Step S2b> Cover Moves to Lower Position

The controller 85 controls the lifting and lowering mechanism 56 to locate the cover 55 in the lower position. The treating space B is sealed substantially gastight.

<Step S2c> Blowout Step

The controller 85 controls the flow regulating valves 68 and 72 based on the determined treating condition (gas concentration G). Consequently, the vaporizing container 64 produces the treating gas and the produced treating gas is attenuated with the inert gas in the piping 65. This adjusts the treating gas to the determined gas concentration G (e.g. value g1).

The controller 85 controls the three-way valve 74 to direct the treating gas to the hydrophobizing unit 31. At this time the controller 85 controls the air-conditioning control device 79 to regulate the temperature of the treating gas, and keeps the temperature of the treating gas at a predetermined temperature. The treating gas adjusted to the predetermined temperature is supplied to the nozzle 57. The nozzle 57 blows out the treating gas. The treating gas blown out of the nozzle 57 spreads to the entire treating space B. The hydrophobizing agent in the treating gas liquefies on the entire surface of the wafer W. That is, the hydrophobizing agent is applied over the entire surface of the wafer W. Consequently, the surface of the wafer W is hydrophobized. Further, the controller 85 controls the suction mechanism 83 to discharge the gas from the hydrophobizing unit 31 (treating space B).

<Step S2d> Retaining Step

The controller 85 closes the flow regulating valves 68 and 72. This stops the production of the treating gas in the vaporizing container 64, and stops the blowout of the treating gas to the wafer W. At this time the controller 85 stops the suction mechanism 83. Consequently, the treating gas fills the treating space B. That is, the surface of the wafer W is covered with the treating gas, without the treating gas blown to the wafer W.

<Step S2e> Replacing Step

The controller 85 controls the three-way valve 74 to supply the inert gas to the hydrophobizing unit 31, and the controller 85 causes the suction mechanism 83 to perform a sucking operation for discharging the treating gas from the treating space B through the exhaust port 58. Consequently, the treating gas in the treating space B is replaced with the inert gas.

<Step S2f> Cover Moves to Upper Position

The controller 85 controls the lifting and lowering mechanism 56 to locate the cover 55 in the upper position. This opens the treating space B.

<Step S2g> Unload Substrate.

The transport mechanism, not shown, unloads the wafer W from the plate 53.

After the surface of the wafer W is hydrophobized through the steps S2a-S2g, the resist film forming step (step S3), exposing step (step S4), and developing step (step S5) described hereinbefore are executed. Consequently, the resist pattern RP is actually obtained. The resist pattern RP has lines L and spaces S. The space width D of the spaces S has been regulated to approximate the target value (e.g. value d1) of the space width D provided by the target E, or substantially to agree with the target value of the space width D provided by the target E.

Figure 8A:
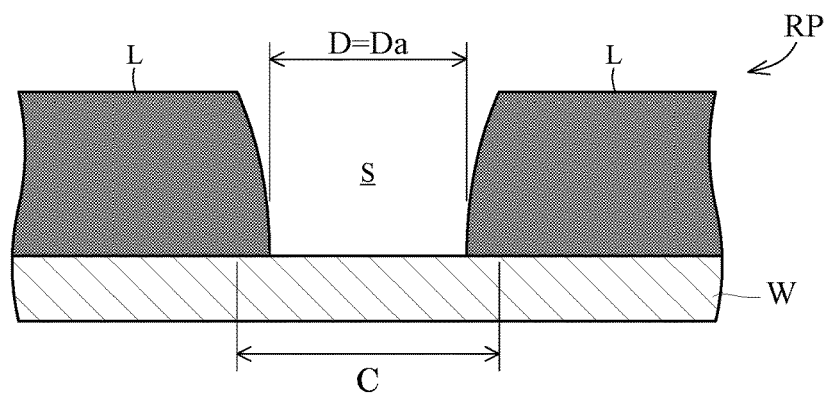
FIGS. 8A-8C are enlarged sectional views schematically showing spaces in different gas concentrations.
Figure 8B:
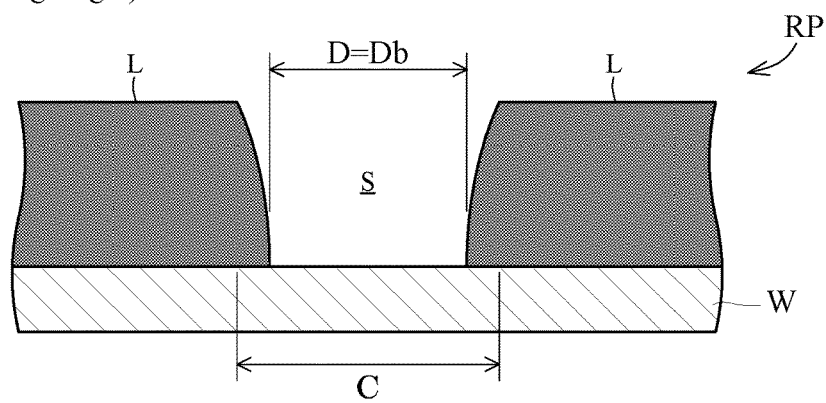
Figure 8C:
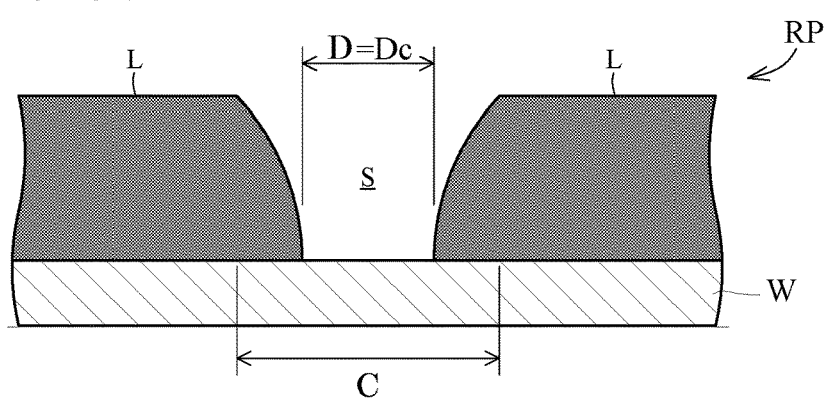

FIGS. 8A-8C are enlarged sectional views of a substrate schematically showing a relationship between gas concentration and space width. FIGS. 8A, 8B and 8C each schematically show spaces S obtained when the surface of the wafer W is hydrophobized using the treating gas whose gas concentration G has value ga, gb or gc. Here, gas concentration ga is higher than gas concentration gb, and gas concentration gb is higher than gas concentration gc.

Space widths D obtained when the surface of the wafer W is hydrophobized using the treating gas whose gas concentration G has values ga, gb and gc are called space widths Da, Db and Dc, respectively. Space width Da is larger than space width Db, and space width Db is larger than space width Dc. Thus, space width D can be fine-adjusted in a range less than the dissolved portion width C by changing the gas concentration G. Such relationship between gas concentration G and space width D (e.g. values ga, gb, gc and space widths Da, Db, Dc) is provided by the pertinent information F1 noted hereinbefore.

Inventors guess the main cause of the variations in the space width D depending on the gas concentration G as follows. For example, when the gas concentration G increases at the time the surface of the wafer W is hydrophobized, the contact angle on the surface of the wafer W will become large (that is, the hydrophobicity of the surface of the wafer W becomes high). When the developing step is executed to remove the resolvable portions Ra and expose the surface of the wafer W, the surface of the wafer W will directly contact the developer. The larger is the contact angle on the surface of the wafer W, the more easily the developer contacting the surface of the wafer W can move (in other words, the larger is the contact angle on the surface of the wafer W, the larger becomes the amount of movement of the developer contacting the surface of the wafer W). The developer contacting the surface of the wafer W moving with increased ease will promote the reaction in which the developer dissolves the dissolvable portions Ra, and enlarge the space width D. Conversely, the lower the gas concentration G becomes, the smaller becomes the contact angle on the surface of the wafer W, and so does the space width D. Thus, Inventors herein guess that the main cause of the variations in the space width D lies in that the contact angle on the surface of the wafer W has varied with the gas concentration G, and that the variations in the contact angle have influenced progress of the development.

Thus, the substrate treating method according to Embodiment 1 produces the following effects.

Since the determining step (step S1) determines a treating condition (gas concentration G) based on the target E regarding the space width D, an appropriate treating condition (gas concentration G) can be determined. The hydrophobizing step (step S2) hydrophobizes the surface of the wafer W on the determined treating condition. Specifically, the surface of the wafer W is hydrophobized using the treating gas adjusted to the gas concentration G. By forming the resist film R on the hydrophobized surface of the wafer W and developing the resist film R, the resist pattern RP can be formed with high dimensional accuracy on the wafer W. Specifically, the dimensional accuracy of the spaces S can be improved. That is, the spaces S having the space widths D closer to the target value provided by the target E can actually be obtained.

Since the gas concentration G is a treating condition for varying the contact angle on the surface of the wafer W, the dimensional accuracy of the spaces S can be improved conveniently. The space width D can conveniently be regulated by changing the gas concentration G.

Since the target E is the target value of the space width D, the determining step can easily determine the treating condition (gas concentration G). The user can also easily set the target E.

The larger is the space width D provided by the target E, the higher becomes the gas concentration G determined in the determining step. On the other hand, the smaller is the space width D provided by the target E, the lower becomes the gas concentration G determined in the determining step. This can conveniently improve the dimensional accuracy of the spaces S actually obtained.

Since the determining step is executed by referring to the pertinent information F1, the gas concentration G can be determined easily.

Since the blowout step attenuates the treating gas with the inert gas, the gas concentration G of the treating gas can be regulated conveniently.

Since the retaining step retains a state of the surface of the wafer W being covered with the treating gas without blowing the treating gas out to the wafer W, the entire surface of the wafer W can be hydrophobized uniformly while inhibiting consumption of the treating gas.

Since the resist film R formed on the wafer W is a thick film, the space width D can be changed effectively by changing the gas concentration G. When the thickness Rt of resist film R is 2 [μm] or more, the space width D is effectively changeable with the gas concentration G. When the thickness Rt of resist film R is 6 [μm] or more, the space width D is more effectively changeable with the gas concentration G. When the thickness Rt of resist film R is 8 [μm] or more, the space width D is still more effectively changeable with the gas concentration G.

The substrate treating method with the resist film forming step can conveniently form the resist film R on the wafer W. The substrate treating method with the developing step can conveniently develop the resist film R on the wafer W.

The blowout step regulates the temperature of the treating gas. Consequently, the blowout step can supply the treating gas at an appropriate temperature to the wafer W.

The substrate treating apparatus 1 with the first outer pipe 77 and introduction pipe 78 can conveniently supply the temperature control air to the outer surface of the piping 65. Consequently, the temperature of the treating gas flowing through the piping 65 can be regulated conveniently.

The first outer pipe 77 and introduction pipe 78 keeping the temperature of the treating gas constant can prevent inadvertent variations in the temperature of the treating gas. There is thus no possibility of inadvertent variations in the contact angle on the surface of the wafer W due to variations in the temperature of the treating gas. That is, there is no possibility of inadvertent variations in the space width D due to variations in the temperature of the treating gas. This can further improve the dimensional accuracy of the spaces S.

Since the temperature of the treating gas is regulated using the temperature control air, the first outer pipe 77 and introduction pipe 78 will never be heated to excess. The treating gas can therefore be handled safely.

Embodiment 2

Embodiment 2 of this invention will be described hereinafter with reference to the drawings.

Embodiment 2 concerns a substrate treating method for forming a resist pattern on substrates. The substrate treating method according to Embodiment 2 can also be executed by the substrate treating apparatus 1 described in Embodiment 1. Description of the construction of the substrate treating apparatus 1 is therefore omitted.

Figure 9:
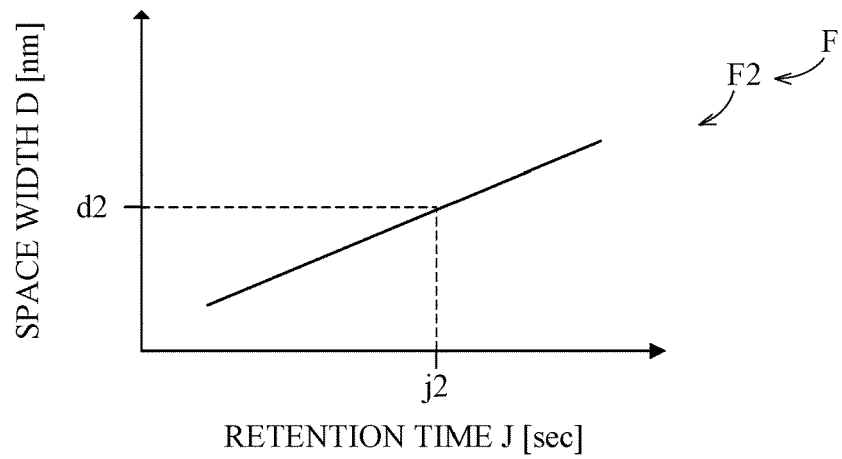
FIG. 9 is a view schematically showing pertinent information.

Reference is made to FIG. 9. The pertinent information F includes pertinent information F2 illustrated in FIG. 9. The pertinent information F2 provides a relationship between retention time J and space width D. The pertinent information F2 provides such a relationship that the space width D increases with the retention time J. The retention time J is a period of time for keeping the state (hereinafter called "retained state") of the surface of the wafer W being covered with the treating gas without blowing the treating gas out to the wafer W. The retention time J corresponds to the time for executing the retaining step (step S2*d*).

The retention time J is a treating condition which influences the contact angle on the surface of the wafer W. More particularly, the longer is the retention time J, the larger becomes the contact angle on the surface of the wafer W. The retention time J is an example of the treating condition in this invention.

Next, a procedure of the substrate treating method according to Embodiment 2 will be described. For expediency, reference is made to FIGS. 3 and 7 of Embodiment 1. Description of the same operations as in Embodiment 1 will be simplified as appropriate.

<Step S1> Determining Step

The controller 85 determines the retention time J based on the target E and pertinent information F2. Reference is made to FIG. 9. When, for example, the target E (specifically, a target value of the space width D) is value d2, the controller 85 determines the retention time J to be value j2.

<Steps S2*a* and S2*b*>

The substrate transport mechanism, not shown, places a wafer W on the plate 53 (step S2*a*). The cover 55 moves to the lower position (step S2*b*).

<Step S2*c*> Blowout Step

The controller 85 controls the flow regulating valve 68, three-way valve 74, and suction mechanism 83 to send the treating gas to the hydrophobizing unit 31. At this time the controller 85 controls the flow regulating valve 72 and air-conditioning control device 79 to keep the gas concentration G and temperature of the treating gas constant. The nozzle 57 blows the treating gas out to the surface of the wafer W on the plate 53.

<Step S2*d*> Retaining Step

The controller 85 closes the flow regulating valves 68 and 72 and stops the suction mechanism 83. This will make the retained state. The controller 85 maintains the retained state for the retention time J.

<Step S2e> Replacing Step

Upon lapse of the retention time J, the controller 85 controls the three-way valve 74 to supply the inert gas to the hydrophobizing unit 31, and causes the suction mechanism 83 to perform a sucking operation for discharging the treating gas from the treating space B through the exhaust port 58. Consequently, the treating gas in the treating space B is replaced with the inert gas. That is, the retained state is canceled.

<Steps S2f and S2g>

The cover 55 moves to the upper position (step S2f). The transport mechanism, not shown, unloads the wafer W from the plate 53 (step S2g).

Subsequently, as shown in FIG. 3, the resist film forming step (step S3), exposing step (step S4), and developing step (step S5) are executed. Consequently, the resist pattern RP is obtained. The spaces S actually obtained have the space width D approximated to the target value provided by the target E, or substantially equivalent to the target value provided by the target E.

Thus, the substrate treating method according to Embodiment 2 produces the same effects as in Embodiment 1. That is, since the determining step (step S1) determines a retention time J based on the target E, an appropriate retention time J can be determined conveniently. The hydrophobizing step (step S2) hydrophobizes the surface of the wafer W for the determined retention time J. By forming the resist film R on the hydrophobized surface of the wafer W and developing the resist film R, the resist pattern RP can be formed with high dimensional accuracy on the wafer W. Specifically, the dimensional accuracy of the actually obtained spaces S can be improved.

Since the retention time J is a treating condition for varying the contact angle on the surface of the wafer W, the dimensional accuracy of the space width D can be improved conveniently. The space width D can conveniently be regulated by changing the retention time J.

The larger is the space width D provided by the target E, the longer becomes the retention time J determined in the determining step. This can conveniently improve the dimensional accuracy of the spaces S actually obtained.

Since the determining step is executed by referring to the pertinent information F2, the retention time J can be determined easily.

When the resist film R formed on the wafer W is a thick film, the space width D can be changed effectively by changing the retention time J. When the thickness Rt of resist film R is 2 [μm] or more, the space width D is effectively changeable with the retention time J. When the thickness Rt of resist film R is 6 [μm] or more, the space width D is more effectively changeable with the retention time J. When the thickness Rt of resist film R is 8 [μm] or more, the space width D is still more effectively changeable with the retention time J.

Embodiment 3

Embodiment 3 of this invention will be described hereinafter with reference to the drawings.

Embodiment 3 concerns a substrate treating method for forming a resist pattern on substrates. The substrate treating method according to Embodiment 3 can also be executed by the substrate treating apparatus 1 described in Embodiment 1. Description of the construction of the substrate treating apparatus 1 is therefore omitted.

The pertinent information F includes pertinent information F3. The pertinent information F3 further includes pertinent information F4 and F5.

Figure 10:
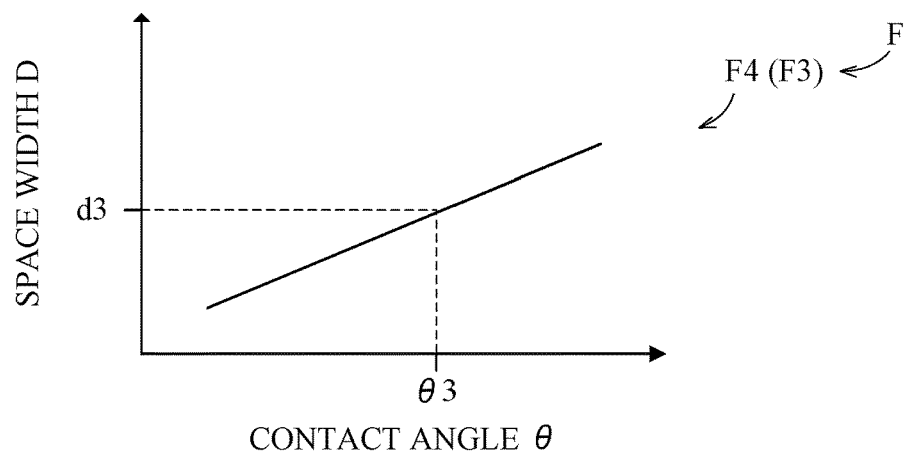
FIG. 10 is a view schematically showing pertinent information.

FIG. 10 schematically shows the pertinent information F4. The pertinent information F4 provides a relationship between space width D and contact angle θ on the surface of the wafer W. The pertinent information F4 provides such a relationship that the space width D increases with the contact angle θ. The pertinent information F4 is an example of the first pertinent information in this invention.

Figure 11:
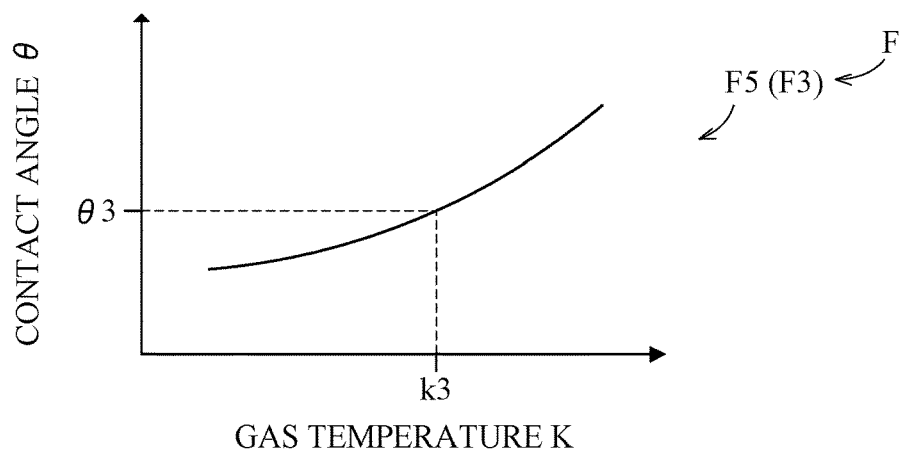
FIG. 11 is a view schematically showing pertinent information.

FIG. 11 schematically shows the pertinent information F5. The pertinent information F5 provides a relationship between contact angle θ and gas temperature K of the treating gas. The pertinent information F5 provides such a relationship that the space width D increases with the gas temperature K. The pertinent information F5 is an example of the second pertinent information in this invention.

As shown in FIG. 11, the gas temperature K is a treating condition which influences the contact angle θ on the surface of the wafer W. More particularly, the higher is the gas temperature K, the larger becomes the contact angle θ on the surface of the wafer W. The gas temperature K is an example of the treating condition in this invention.

Next, a procedure of the substrate treating method according to Embodiment 3 will be described. For expediency, reference is made to FIGS. 3 and 7 of Embodiment 1. Description of the same operations as in Embodiment 1 will be simplified as appropriate.

<Step S1> Determining Step

The controller 85 determines the gas temperature K based on the target E and pertinent information F3. Reference is made to FIGS. 10 and 11. When, for example, the target E (specifically, a target value of the space width D) is value d3, the controller 85 identifies contact angle θ3 corresponding to the space width d3 and identifies value k3 corresponding to the contact angle θ3. And the controller 85 determines the value k3 as gas temperature K.

<Steps S2a and S2b>

The substrate transport mechanism, not shown, places a wafer W on the plate 53 (step S2a). The cover 55 moves to the lower position (step S2b).

<Step S2c> Blowout Step

The controller 85 controls the flow regulating valve 68, three-way valve 74, air-conditioning control device 79, and suction mechanism 83 to regulate the gas temperature K of the treating gas and send the treating gas to the hydrophobizing unit 31. Specifically, the controller 85 controls the air-conditioning control device 79 to control the temperature and supplied quantity of the temperature control air. The air-conditioning control device 79 supplies the temperature control air regulated to a predetermined temperature to the introduction pipe 78 at a predetermined flow rate. The introduction pipe 78 supplies the temperature control air into the first outer pipe 77. Inside the first outer pipe 77 the temperature control air flows over the outer surface of the piping 65. That is, the outer surface of the piping 65 is exposed to the temperature control air. This regulates the temperature of the treating gas flowing through the piping 65 to the value k3. The treating gas at the regulated gas temperature K is supplied to the nozzle 57. At this time the controller 85 controls the flow regulating valve 72 to keep the gas concentration G of the treating gas constant. The nozzle 57 blows the treating gas regulated to the gas temperature K out to the surface of the wafer W.

\<Step S2d\> Retaining Step

The controller 85 closes the flow regulating valves 68 and 72 and stops the suction mechanism 83. This will make the retained state.

\<Step S2e\> Replacing Step

The controller 85 controls the three-way valve 74 to supply the inert gas to the hydrophobizing unit 31, and causes the suction mechanism 83 to perform a sucking operation for discharging the treating gas from the treating space B through the exhaust port 58. Consequently, the treating gas in the treating space B is replaced with the inert gas.

\<Steps S2f and 2g\>

The cover 55 moves to the upper position (step S2f). The transport mechanism, not shown, unloads the wafer W from the plate 53 (step S2g).

Subsequently, as shown in FIG. 3, the resist film forming step (step S3), exposing step (step S4), and developing step (step S5) are executed. Consequently, the resist pattern RP is obtained. The spaces S actually obtained have the space width D approximated to the target value provided by the target E, or substantially equivalent to the target value provided by the target E.

Thus, the substrate treating method according to Embodiment 3 produces the same effects as in Embodiment 1. That is, since the determining step (step S1) determines a gas temperature K based on the target E, an appropriate gas temperature K can be determined conveniently. The hydrophobizing step (step S2) hydrophobizes the surface of the wafer W using the treating gas at the determined gas temperature K. By forming the resist film R on the hydrophobized surface of the wafer W and developing the resist film R, the resist pattern RP can be formed with high dimensional accuracy on the wafer W. Specifically, the dimensional accuracy of the actually obtained spaces S can be improved.

Since the gas temperature K is a treating condition for varying the contact angle θ on the surface of the wafer W, the dimensional accuracy of the space width D can be improved conveniently. The space width D can conveniently be regulated by changing the gas temperature K.

The larger is the space width D provided by the target E, the higher becomes the gas temperature K determined in the determining step. This can conveniently improve the dimensional accuracy of the spaces S actually obtained.

Since the determining step is executed by referring to the pertinent information F3 (F4 and F5), the gas temperature K can be determined easily.

The pertinent information F3 includes pertinent information F4 and pertinent information F5. The pertinent information F4 provides the relationship between space width D and contact angle θ on the surface of the wafer W. The pertinent information F5 provides the relationship between contact angle θ and gas temperature K.

Here, the pertinent information F4 is obtained by conducting an experiment or simulation on the steps from step S3 to step S5, for example. On the other hand, the relationship between space width D and gas temperature K is obtained by conducting an experiment or simulation on the steps from step S2 to step S5. Therefore, an operation for acquiring the relationship between space width D and gas temperature K is more complicated than an operation for acquiring the pertinent information F4. The pertinent information F4 can therefore be set relatively easily. The pertinent information F5 is obtained by conducting an experiment or simulation on step S2, for example. The pertinent information F5 can therefore be determined more easily than the relationship between space width D and gas temperature K. The pertinent information F5 can therefore be set relatively easily.

Further, the pertinent information F4 can be appropriated for executing the determining step to determine treating conditions other than gas temperature K. When, for example, the determining step determines gas concentration G as a treating condition, pertinent information F5g (not shown) which provides a relationship between contact angle θ and gas concentration G may be prepared apart from the pertinent information F4, which will allow the pertinent information F4 and pertinent information F5g to constitute the pertinent information F3. Thus, the pertinent information F3 can be realized only by setting the pertinent information F5g. Moreover, the setting itself of the pertinent information F5g is relatively easy. Thus, the pertinent information F3 can be constructed efficiently when changing the type of treating condition or when using plural types of treating condition.

When the resist film R formed on the wafer W is a thick film, the space width D can be changed effectively by changing the gas temperature K. When the thickness Rt of resist film R is 2 [μm] or more, the space width D is effectively changeable with the gas temperature K. When the thickness Rt of resist film R is 6 [μm] or more, the space width D is more effectively changeable with the gas temperature K. When the thickness Rt of resist film R is 8 [μm] or more, the space width D is still more effectively changeable with the gas temperature K.

The substrate treating apparatus 1 with the first outer pipe 77 and introduction pipe 78 can conveniently supply the temperature control air to the outer surface of the piping 65. The temperature of the treating gas flowing through the piping 65 can conveniently be changed according to the gas temperature K determined in the determining step.

Embodiment 4

Embodiment 4 of this invention will be described hereinafter with reference to the drawings.

Embodiment 4 concerns a substrate treating method for forming a resist pattern on substrates. The substrate treating method according to Embodiment 4 can also be executed by the substrate treating apparatus 1 described in Embodiment 1. Description of the construction of the substrate treating apparatus 1 is therefore omitted.

Figure 12:
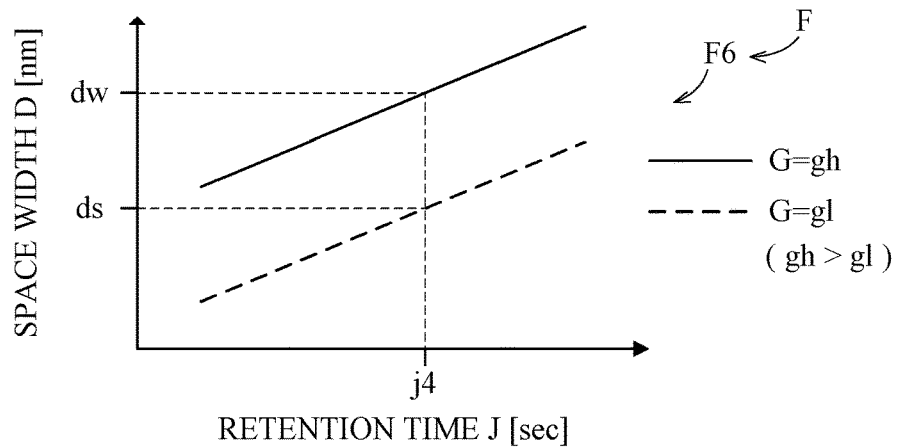
FIG. 12 is a view schematically showing pertinent information.

Reference is made to FIG. 12. The pertinent information F includes pertinent information F6 illustrated in FIG. 12. The pertinent information F6 provides a relationship between a combination of gas concentration G and retention time J, and space width D. The solid line represents a relationship between the retention time J and space width D when the gas concentration G has value gh. The dotted line represents a relationship between the retention time J and space width D when the gas concentration G has value gl. Here, gh is larger than gl.

The pertinent information F6 provides the following relationships:

When the gas concentration G is the same, the space width D increases with the retention time J.

When the retention time J is the same, the space width D corresponding to the gas concentration gh is larger than the space width D corresponding to the gas concentration gl.

The gas concentration G and retention time J are examples of the treating condition in this invention.

Next, a procedure of the substrate treating method according to Embodiment 4 will be described. For expediency, reference is made to FIGS. 3 and 7 of Embodiment 1. Description of the same operations as in Embodiment 1 will be simplified as appropriate.

<Step S1> Determining Step

The controller 85 determines the gas concentration G and retention time J based on the target E and pertinent information F6. Reference is made to FIG. 12. When, for example, the target E (specifically, a target value of the space width D) is value dw, the controller 85 determines the gas concentration G to be value gh and the retention time J to be value j4. When, for example, the target E is value ds smaller than value dw, the controller 85 determines the gas concentration G to be value gl and the retention time J to be value j4.

<Steps S2a and S2b>

The substrate transport mechanism, not shown, places a wafer W on the plate 53 (step S2a). The cover 55 moves to the lower position (step S2b).

<Step S2c> Blowout Step

The controller 85 controls the flow regulating valves 68 and 72, three-way valve 74, and suction mechanism 83 to supply the treating gas adjusted to the gas concentration G to the surface of the wafer W.

<Step S2d> Retaining Step

The controller 85 closes the flow regulating valves 68 and 72 and stops the suction mechanism 83. This will make the retained state. The controller 85 maintains the retained state for the retention time J.

<Step S2e> Replacing Step

The controller 85 controls the three-way valve 74 to supply the inert gas to the hydrophobizing unit 31, and causes the suction mechanism 83 to perform a sucking operation for discharging the treating gas from the treating space B through the exhaust port 58. Consequently, the treating gas in the treating space B is replaced with the inert gas.

<Steps S2f and S2g>

The cover 55 moves to the upper position (step S2f). The transport mechanism, not shown, unloads the wafer W from the plate 53 (step S2g).

Subsequently, as shown in FIG. 3, the resist film forming step (step S3), exposing step (step S4), and developing step (step S5) are executed. Consequently, the resist pattern RP is obtained. The spaces S actually obtained have the space width D approximated to the target value provided by the target E, or substantially equivalent to the target value provided by the target E.

Thus, the substrate treating method according to Embodiment 4 produces the same effects as in Embodiment 1. That is, since the determining step (step S1) determines a gas concentration G and a retention time J based on the target E, an appropriate gas concentration G and retention time J can be determined conveniently. The hydrophobizing step (step S2) executes the blowout step using the treating gas with the determined gas concentration G, and executes the retaining step for the determined retention time J. By forming the resist film R on the hydrophobized surface of the wafer W and developing the resist film R, the resist pattern RP can be formed with high dimensional accuracy on the wafer W. Specifically, the dimensional accuracy of the actually obtained spaces S can be improved.

Since the gas concentration G and retention time J are the treating conditions for varying the contact angle on the surface of the wafer W, the dimensional accuracy of the space width D can be improved conveniently. The space width D can conveniently be regulated by changing the gas concentration G and retention time J.

Since the determining step determines the plural types of treating conditions (gas concentration G and retention time J) based on the target E, the treating conditions can be determined finely. Consequently, the dimensional accuracy of the space width D can be further improved. Further, since the determining step determines the plural types of treating conditions, the space width D can be regulated over a still larger range.

When, for example, the retention time J is too short, the entire surface of the wafer W cannot be hydrophobized uniformly. Therefore, even if only the retention time J is changed, the space width D can be regulated within a limited range. However, by changing both the retention time J and gas concentration G as in this embodiment, the range for regulating the space width D can be enlarged without shortening the retention time J to excess. Similarly, even if only the gas concentration G is changed, the space width D can be regulated within a limited range. However, by changing both the retention time J and gas concentration G as in this embodiment, the range for regulating the space width D can be enlarged without making the concentration G excessively high or low.

Since the determining step is executed by referring to the pertinent information F6, the gas concentration G and retention time J can be determined easily.

Embodiment 5

Embodiment 5 of this invention will be described hereinafter with reference to the drawings.

Embodiment 5 concerns a substrate treating method for forming a resist pattern on substrates. The substrate treating method according to Embodiment 5 can also be executed by the substrate treating apparatus 1 described in Embodiment 1. Description of the construction of the substrate treating apparatus 1 is therefore omitted.

In the substrate treating method in Embodiment 5, a pre-dispense step is executed each time the gas concentration G is changed. A procedure of the substrate treating method according to Embodiment 5 will be described hereinafter. Description of the same operations as in Embodiment 1 will be simplified as appropriate.

Figure 13:
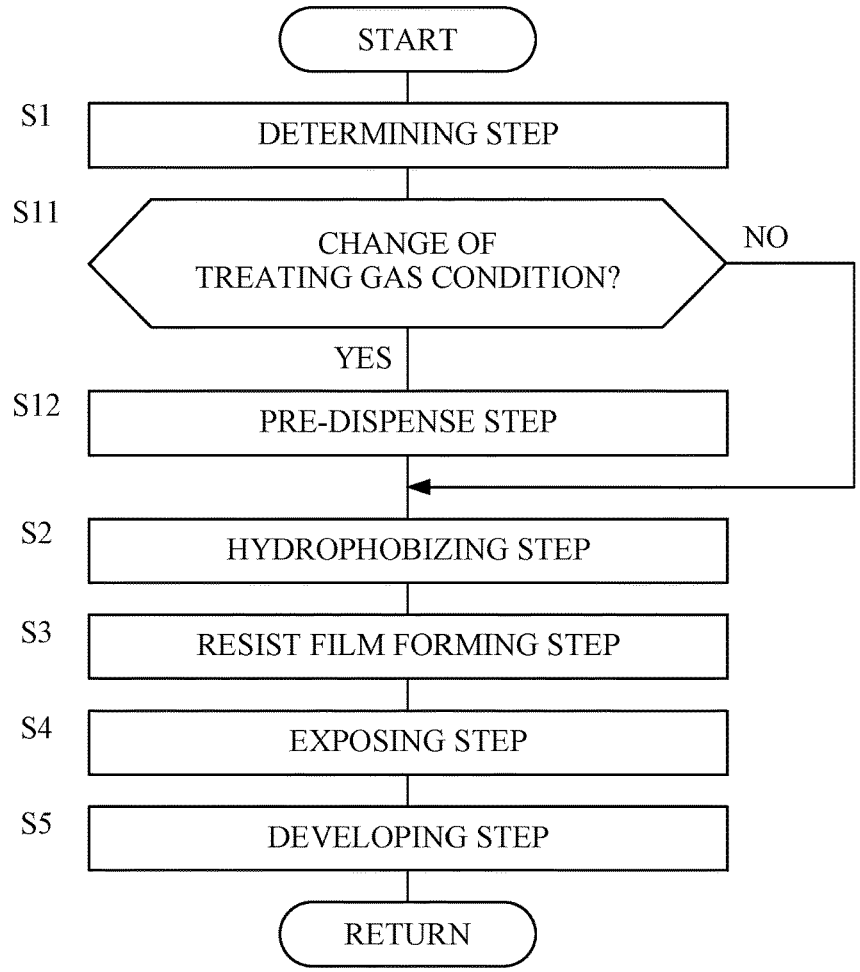
FIG. 13 is a flow chart showing a procedure of the substrate treating method.

FIG. 13 is a flow chart showing the procedure of the substrate treating method according to Embodiment 5, <Step S1> Determining Step The controller 85 determines the gas concentration G based on the target E and pertinent information F1.

<Step S11> Change of Treating Gas Condition?

The controller 85 checks whether the treating gas condition has changed from the treating condition determined last time to the treating condition determined this time. When it is determined that the treating gas condition has changed, the operation proceeds to step S12. Otherwise, the operation proceeds to step S2.

Here, "the treating condition determined this time" is the treating condition determined last, and "the treating condition determined last time" is the treating condition determined last but one. The treating gas condition refers to the treating condition relating to the treating gas used in the hydrophobizing step in particular among the treating conditions. The gas concentration G is an example of treating gas conditions.

<Step S12> Pre-Dispense Step

No wafer W is placed on the plate 53. In this state, the cover 55 moves to the lower position whereby the treating space B is sealed substantially gastight. The controller 85 controls the flow regulating valves 68 and 72, three-way valve 74, and suction mechanism 83 to regulate the treating gas to the gas concentration G determined this time, and blow it out into the treating space B. The treating gas blown out into the treating space B is discharged by the treating gas exhaust device 81. After the pre-dispense step is completed, the operation proceeds to step S2.

The pre-dispense step, preferably, is continued until the nozzle 57 begins to blow out the treating gas with the gas concentration G determined this time. Or the pre-dispense step, preferably, is continued until the treating gas blown out of the nozzle 57 stabilizes at the determined gas concentration G.

The pre-dispense step is an example of the prior blowout step in this invention.

Subsequently, the hydrophobizing step (step S2), resist film forming step (step S3), exposing step (step S4), and developing step (step S5) are executed.

Thus, the substrate treating method according to Embodiment 5 produces the same effects as in Embodiment 1.

The substrate treating method according to Embodiment 5, with the pre-dispense step, the treating gas can be blown out toward anything other than a wafer W, and then thrown away. The treating gas blowout can be tried in this way.

The pre-dispense step is executed every time a change is made to the treating gas condition determined in the determining step. In other words, when the treating gas condition is different between two hydrophobizing steps executed one before or after the other, the pre-dispense step is executed after the preceding hydrophobizing step and before the succeeding hydrophobizing step. This measure can discard the treating gas having the gas concentration G before the change and remaining in the nozzle 57, piping 65, and so on. Therefore, even in the first hydrophobizing step carried out after the change of the treating gas condition, the wafer W can be supplied with the treating gas regulated to the changed gas concentration G with high accuracy. Therefore, even the first hydrophobizing step carried out after the change of the treating gas condition can prevent a lowering of treatment quality for hydrophobizing the surface of the wafer W. As a result, a lowering of the dimensional accuracy of the resist pattern RP can be inhibited.

When no change is made to the treating gas condition determined in the determining step, a plurality of hydrophobizing steps are carried out in succession without the pre-dispense step. In other words, when the treating gas condition is unchanged between two hydrophobizing steps executed one before or after the other, the preceding hydrophobizing step is followed by the succeeding hydrophobizing step without the pre-dispense step in between. This can shorten the time taken in hydrophobizing the surfaces of wafers W.

Embodiment 6

Embodiment 6 of this invention will be described hereinafter with reference to the drawings.

Embodiment 6 is different from Embodiment 1 in the construction of treating gas temperature controller 76. Thus, the construction of treating gas temperature controller 76 will be described in detail hereinafter. The components identical to those of Embodiment 1 are shown with the same signs, and will not particularly be described.

Figure 14:
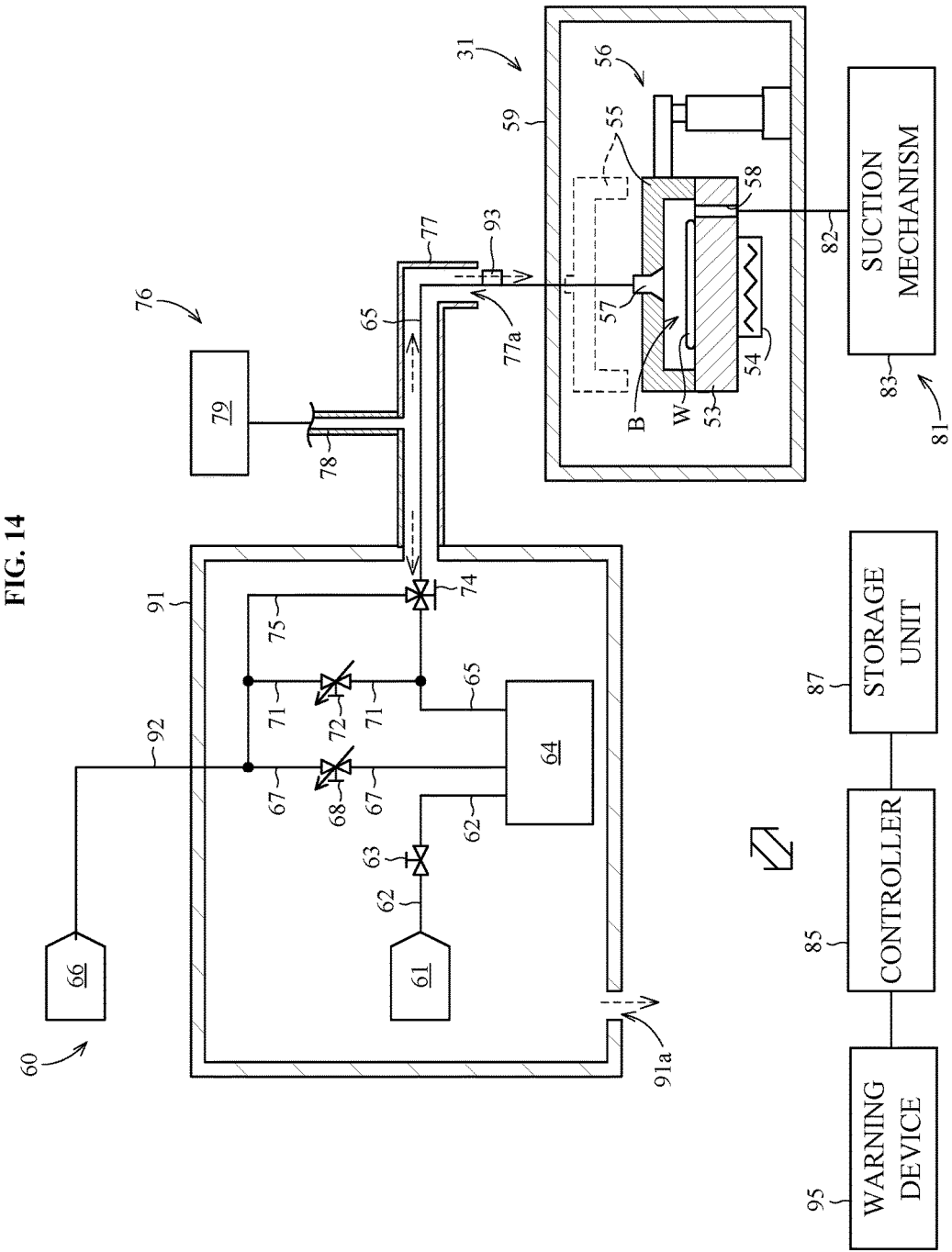
FIG. 14 is a view showing a hydrophobizing unit and components relating thereto.

FIG. 14 is a view showing a hydrophobizing unit and components relating thereto. The treating gas temperature controller 76 has a first outer pipe 77, an introduction pipe 78 and an air-conditioning control device 79. One end of the first outer pipe 77 extends along the piping 65 to a position adjacent the hydrophobizing unit 31. In other words, one end of the first outer pipe 77 extends to a position adjacent one end of the piping 65 connected to the hydrophobizing unit 31.

The one end of the first outer pipe 77 is open. The one end of the first outer pipe 77 is an exhaust port 77a for discharging gas from inside the first outer pipe 77.

The introduction pipe 78 is directly connected to the first outer pipe 77. The first outer pipe 77 is connected to the introduction pipe 78 in a position closer to the other end than to the exhaust port 77a of the first outer pipe 77. The exhaust port 77a is an example of the first exhaust port in this invention. The introduction pipe 78 is an example of the introductory portion in this invention.

The substrate treating apparatus 1 includes a cabinet 91. The cabinet 91 houses the vaporizing container 64. The cabinet 91 further houses the hydrophobizing agent supply source 61, piping 62, and switch valve 63. The piping 65 is installed to penetrate the cabinet 91. The cabinet 91 houses part adjacent the other end of the piping 65.

The piping 67, 71 and 75 for supplying the inert gas are merged into piping 92 inside the cabinet 91. The piping 92 is installed to penetrate the cabinet 91. The piping 92 is connected to the gas supply source 66 outside the cabinet 91.

The cabinet 91 houses all of the piping 67, 71 and 75 and part of the piping 92. The cabinet 91 further houses the flow regulating valve 68, flow regulating valve 72, and three-way valve 74.

The other end of the first outer pipe 77 is connected to the cabinet 91. The interiors of the first outer piping 77 and cabinet 91 communicate with each other.

The cabinet 91 has an exhaust port 91a open to the ambient. The gas inside the cabinet 91 is discharged through the exhaust port 91a. The cabinet 91 is an example of the housing in this invention. The exhaust port 91a is an example of the housing-side exhaust port in this invention.

The treating gas temperature controller 76 further includes a temperature detector 93 attached to the outer surface of the piping 65. Preferably, the temperature detector 93 is installed near the hydrophobizing unit 31. More particularly, the temperature detector 93, preferably, is disposed in a position close to the one end of the piping 65 connected to the hydrophobizing unit 31. The temperature detector 93 directly detects the surface temperature of the piping 65. Consequently, the temperature detector 93 indirectly detects the temperature of the treating gas flowing through the piping 65. The temperature detector 93 is connected to the controller 85 for communication therewith. Detection results of the temperature detector 93 are outputted to the controller 85.

The substrate treating apparatus 1 includes a warning device 95. The warning device 95 is connected to the controller 85 for communication therewith. The warning device 95 gives an alarm to the user. The alarm may be audio information such as a warning sound or voice, and/or visual information such as an alarm lamp, a blinking light, and an image.

The storage unit 87 stores a reference range. The reference range is information regarding a temperature range. The temperature range is, for example, a range of ±1 degree with respect to the gas temperature K of the treating gas set beforehand. The temperature range is, for example, a range of ±1 degree with respect to the gas temperature K of the treating gas determined in the determining step. The reference range is set beforehand, at least before executing the hydrophobizing step.

The treating gas temperature controller 76 constructed in this way operates as follows.

When the controller 85 controls the air-conditioning control device 79, the latter supplies the temperature control air to the introduction pipe 78. The introduction pipe 78 introduces the temperature control air into the first outer pipe 77.

FIG. 14 schematically shows flows of the temperature control air in dotted lines. Inside the first outer pipe 77 the temperature control air flows along the outer surface of the piping 65. Consequently, the temperature control air regulates the temperature of the treating gas flowing through the piping 65. Part of the temperature control air flows toward the one end of the piping 65 to be released through the exhaust port 77a. The rest of the temperature control air flows to the other end of the piping 65 and into the cabinet 91.

Inside the cabinet 91 the temperature control air is supplied to the elements 61-65, 67, 68, 71, 72, 74 and 75 housed in the cabinet 91. In other words, outer surfaces of the elements 61-65, 67, 68, 71, 72, 74 and 75 housed in the cabinet 91 are exposed to the temperature control air. Consequently, the temperature control air regulates temperatures of the treating gas, inert gas, and hydrophobizing agent inside the elements 61-65, 67, 68, 71, 72, 74 and 75. The temperature control air is released from the cabinet 91 through the exhaust port 91a.

The controller 85 monitors actual temperatures of the treating gas based on detection results of the temperature detector 93. Specifically, the controller 85 checks whether the detection results of the temperature detector 93 are within the reference range. The monitoring by the controller 85, preferably, is carried out at least while the treating gas is supplied to the hydrophobizing unit 31. Or the monitoring by the controller 85, preferably is carried out at least while the hydrophobizing unit 31 is treating the wafer W.

When the detection results of the temperature detector 93 are not within the reference range, the controller 85 activates the warning device 95 to raise the alarm. In addition, the controller 85 controls the flow regulating valves 68 and 72 and so on to interrupt the supply of the treating gas to the hydrophobizing unit 31. The controller 85 controls the lifting and lowering mechanism 56, suction mechanism 83 and so on to interrupt the treatment by the hydrophobizing unit 31. On the other hand, when the detection results of the temperature detector 93 are within the reference range, the controller 85 withholds the alarm. Further, the controller 85 permits the supply of the treating gas to the hydrophobizing unit 31 and the treatment by the hydrophobizing unit 31.

Thus, the substrate treating method according to Embodiment 6 produces the following effects.

The substrate treating apparatus 1 with the first outer pipe 77 and introduction pipe 78 can conveniently change and regulate the temperature of the treating gas flowing through the piping 65. Consequently, the surface of the wafer W can be hydrophobized with high accuracy, and the resist pattern RP with high dimensional accuracy can be formed on the wafer W.

The substrate treating apparatus 1 with the first outer pipe 77 and introduction pipe 78 can keep constant the temperature of the treating gas flowing through the piping 65. In other words, inadvertent variations in the temperature of the treating gas can be prevented. There is thus no possibility of inadvertent variations in the contact angle on the surface of the wafer W due to variations in the temperature of the treating gas. That is, there is no possibility of inadvertent variations in the space width D due to variations in the temperature of the treating gas. This can further improve the dimensional accuracy of the spaces S.

Since one end of the first outer pipe 77 extends along the piping 65 to a position adjacent the one end of the piping 65, the temperature control air can be supplied to a portion of the piping 65 near the hydrophobizing unit 31. The temperature of the treating gas used in the hydrophobizing unit 31 can therefore conveniently be controlled.

The first outer pipe 77 with the exhaust port 77a allows the temperature control air to flow smoothly through the first outer pipe 77. This can efficiently regulate the temperature of the treating gas flowing through the piping 65.

Since the position of connection between the first outer pipe 77 and introduction pipe 78 is closer to the other end of the first outer pipe 77 than to the exhaust port 77a, part of the temperature control air flows toward the other end of the first outer pipe 77, and flows from the first outer pipe 77 into the cabinet 91. The flow of this part of the temperature control air can appropriately prevent gas from flowing (counterflowing) from the cabinet 91 into the first outer pipe 77. Therefore, even if the treating gas should leak from the cabinet 91, there would be no possibility of the treating gas flowing out of the cabinet 91 into the first outer pipe 77, and there would also be no possibility of the treating gas reaching near the hydrophobizing unit 31 through the first outer pipe 77.

Since the first outer pipe 77 and cabinet 91 communicate with each other, the introduction pipe 78 can conveniently supply the temperature control air to the cabinet 91 through the first outer pipe 77. This can control the temperatures of the treating gas, inert gas, and hydrophobizing agent inside the elements installed inside the cabinet 91.

Specifically, since the vaporizing container 64 is installed inside the cabinet 91, the gas temperature of the treating gas can be regulated as from when the treating gas is produced. The gas temperature of the treating gas can therefore be controlled reliably.

Since the hydrophobizing agent supply source 61 is installed inside the cabinet 91, the temperature of the hydrophobizing agent which is the basis for producing the treating gas can be regulated. The temperature of the treating gas can therefore be controlled with increased reliability. Similarly, since the piping 62 is installed inside the cabinet 91, the temperature of the hydrophobizing agent which is the basis for the treating gas can be regulated. The temperature of the treating gas can therefore be controlled with increased reliability.

Since the piping 67 is installed inside the cabinet 91, the temperature of the inert gas used in producing the treating gas can be regulated. The temperature of the treating gas can therefore be controlled with increased reliability.

Since the piping 71 is installed inside the cabinet 91, the temperature of the inert gas used for attenuation of the treating gas can be regulated. The temperature of the treating gas can therefore be controlled with increased reliability.

The substrate treating apparatus 1 with the temperature detector 93 can conveniently detect actual temperatures of the treating gas.

The substrate treating apparatus 1 with the controller 85 can conveniently monitor actual temperatures of the treating gas.

Since the controller 85 raises the alarm based on the detection results of the temperature detector 93, it can conveniently notify the user that actual temperatures of the treating gas is outside the reference range.

Since the controller 85 interrupts the supply of the treating gas to the hydrophobizing unit 31 based on the detection result of the temperature detector 93, it can stop at an early stage the treating gas being supplied at an inappropriate temperature to the wafer W.

Since the controller 85 interrupts the treatment by the hydrophobizing unit 31 based on the detection result of the temperature detector 93, it can stop at an early stage the treatment using the treating gas at an inappropriate temperature.

This invention is not limited to the foregoing embodiments, but may be modified as follows:

(1) In the foregoing embodiments, the target E is a target value of the space width D. The invention is not limited to this. For example, the target E may be an amount of adjustment to a reference value. The reference value may, for example, be any one of an upper limit value, lower limit value, and permissible value of the space width D. Alternatively, the reference value may be a space width D obtained under a specific treating condition. The amount of adjustment may, for example, be a distance increased or decreased from the reference value.

(2) In the foregoing embodiments, the gas concentration G, retention time J, and gas temperature K exemplify the treating conditions. The invention is not limited to these. Other examples of the treating conditions are given below:

Gas flow rate of the treating gas blown out to the wafer W
Temperature of the wafer W
Blowout time for blowing the treating gas out to the wafer W
Treating time for hydrophobizing the surface of the wafer Here, the blowout time corresponds to the time for executing the blowout step.

The treating time is a comprehensive concept which includes the retention time J, blowout time, and so on, and which is defined as appropriate according to the hydrophobizing step. For example, the treating time can be defined as appropriate even if the hydrophobizing step does not include the blowout step or retaining step.

(3) In foregoing Embodiments 1, 2 and 3, the determining step determines one type of treating condition, and in Embodiment 4, the determining step determines two types of treating condition. The invention is not limited to these. The determining step may determine three or more types of treating condition.

(4) In foregoing Embodiment 4, the two types of treating condition determined in the determining step are gas concentration G and retention time J. The invention is not limited to this. For example, the two types of treating condition may be any two of the above-noted gas concentration G, retention time J, gas temperature K, gas flow rate, temperature of the wafer W, blowout time, and treating time.

(5) In foregoing Embodiment 5, the gas concentration G exemplifies the treating gas condition. The invention is not limited to this. For example, the treating gas condition may be gas temperature K. Or the treating gas condition may be gas flow rate.

(6) In the substrate treating method according to foregoing Embodiment 5, the pre-dispense step may monitor an actual concentration of the treating gas blown out. This modified embodiment can determine appropriately whether to end the pre-dispense step or not, and can end the pre-dispense step at an optimal time.

(7) In the foregoing embodiments, the resist pattern RP is what is called line and space. The invention is not limited to this. The substrate treating method according to each embodiment is applicable to various resist patterns RP. For example, the resist pattern RP may be a hole pattern and a dot pattern. Such modified embodiments can also improve the dimensional accuracy of the resist pattern RP. In each foregoing embodiment, the resist pattern RP includes lines L and spaces S. The invention is not limited to this. For example, the resist pattern RP may include at least any of spaces, lines, holes, and dots. The holes are through holes and via holes, for example. When, for example, the resist pattern RP includes holes, the dimensional accuracy of the resist pattern RP can be improved. When, for example, the resist pattern RP includes dots also, the dimensional accuracy of the resist pattern RP can be improved.

(8) In the foregoing embodiments, the spaces S exemplify the dissolved areas, and the size of spaces S, i.e. the space width D, exemplifies the dissolved area size. The invention is not limited to this. For example, the dissolved areas may be holes and the dissolved area size may be the size of the holes. The size of the holes is a diameter of the holes, for example. According to this modified embodiment, the accuracy of the size of the holes can be improved conveniently. Or the dissolved areas may be areas formed around dots to demarcate outlines of the dots, and the dissolved size may be the size of the dots. The size of the dots is a distance between the dots, for example. According to this modified embodiment, the accuracy of the size of the dots can be improved conveniently.

(9) In the foregoing embodiments, the substrate treating apparatus 1 (each coating unit 34) executes the resist film forming step. The invention is not limited to this. That is, the substrate treating apparatus 1 does not need to execute the resist film forming step. For example, the resist film forming step may be executed outside the substrate treating apparatus 1. Similarly, in the foregoing embodiments, the substrate treating apparatus 1 (each developing unit 44) executes the developing step. The invention is not limited to this. That is, the substrate treating apparatus 1 does not need to execute the developing step. For example, the developing step may be executed outside the substrate treating apparatus 1.

(10) The substrate treating method according to each foregoing embodiment may further include a step of forming antireflection film on the surface of the wafer W. The step of forming antireflection film on the surface of the wafer W, preferably, is executed after the hydrophobizing step and before the resist film forming step. The substrate treating method according to each foregoing embodiment may include a step of forming protective film on the surface of the resist film. The step of forming protective film on the surface of the resist film, preferably, is executed after the resist film forming step and before the exposing step.

(11) In the foregoing embodiments, the introduction pipe 78 is directly connected to the first outer pipe 77. The invention is not limited to this. The introduction pipe 78 may be directly connected to the cabinet 91. This allows the introduction pipe 78 to supply the temperature control air directly into the cabinet 91. Or the introduction pipe 78 may be connected to both the first outer pipe 77 and cabinet 91. With this construction, the introduction pipe 78 can supply the temperature control air directly into both the first outer pipe 77 and cabinet 91.

Figure 15:
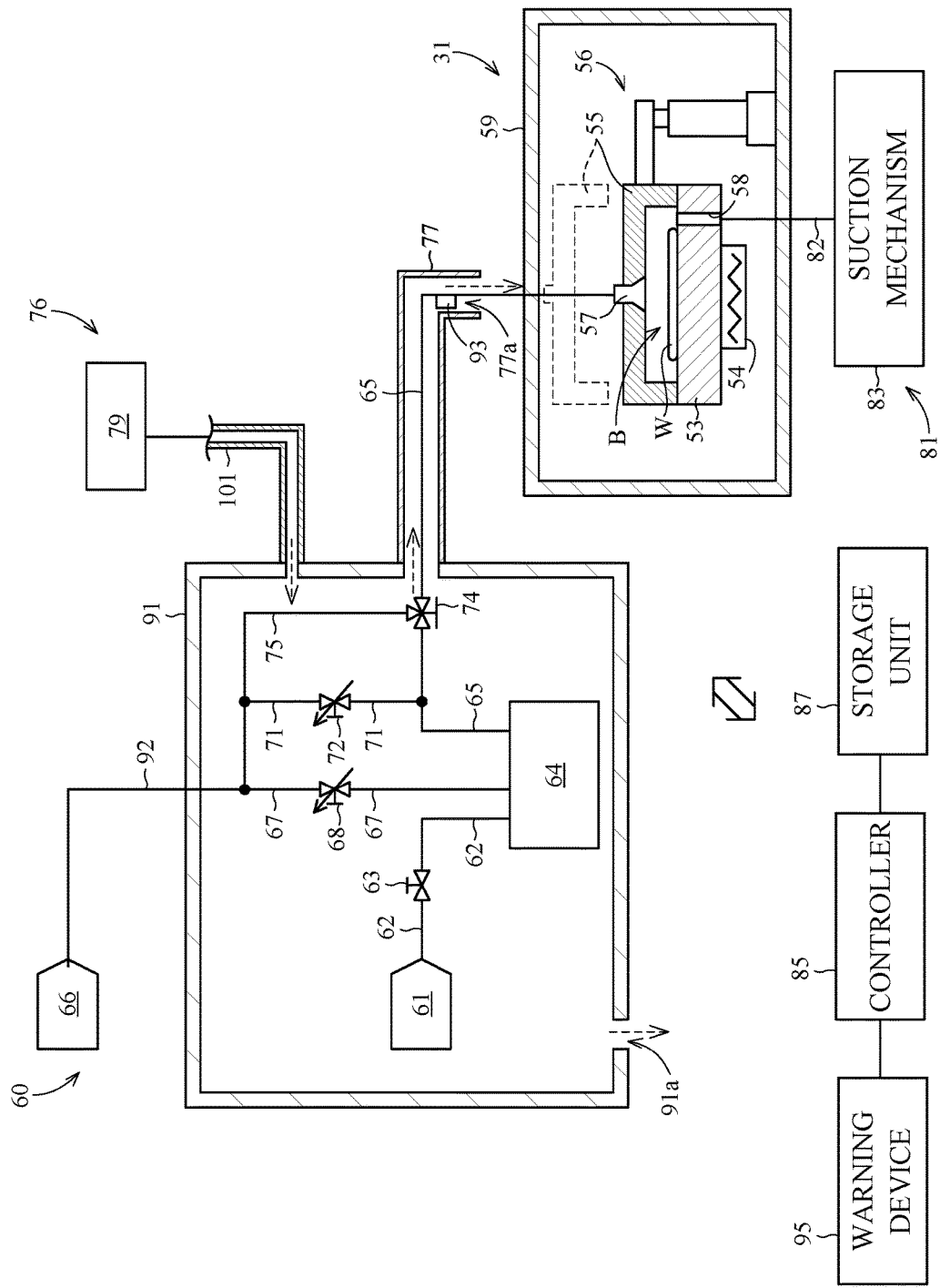
FIG. 15 is a view showing a hydrophobizing unit and components relating thereto according to a modified embodiment.

Reference is made to FIG. 15. FIG. 15 is a view showing a hydrophobizing unit and components relating thereto according to a modified embodiment. The components identical to those of Embodiment 1 are shown with the same signs, and will not particularly be described.

As seen, the treating gas temperature controller 76 has an introduction pipe 101. The introduction pipe 101 is connected to the air-conditioning control device 79. The introduction pipe 101 is directly connected to the cabinet 91 to supply the temperature control air directly into the cabinet 91. Part of the temperature control air inside the cabinet 91 is discharged from the exhaust port 91a. The rest of the temperature control air flows out of the cabinet 91 into the first outer pipe 77 and is discharged from the exhaust port 77a. In this modified embodiment also, the temperature of the treating gas flowing through the piping 65 can conveniently be changed, adjusted and maintained. The introduction pipe 101 is an example of the introductory portion in this invention.

(12) The substrate treating apparatus 1 described in each foregoing embodiment may further include a construction exclusively for regulating the temperature of the hydrophobizing agent. The substrate treating apparatus 1 described in each foregoing embodiment may further include a construction exclusively for regulating the temperature of the inert gas.

Figure 16:
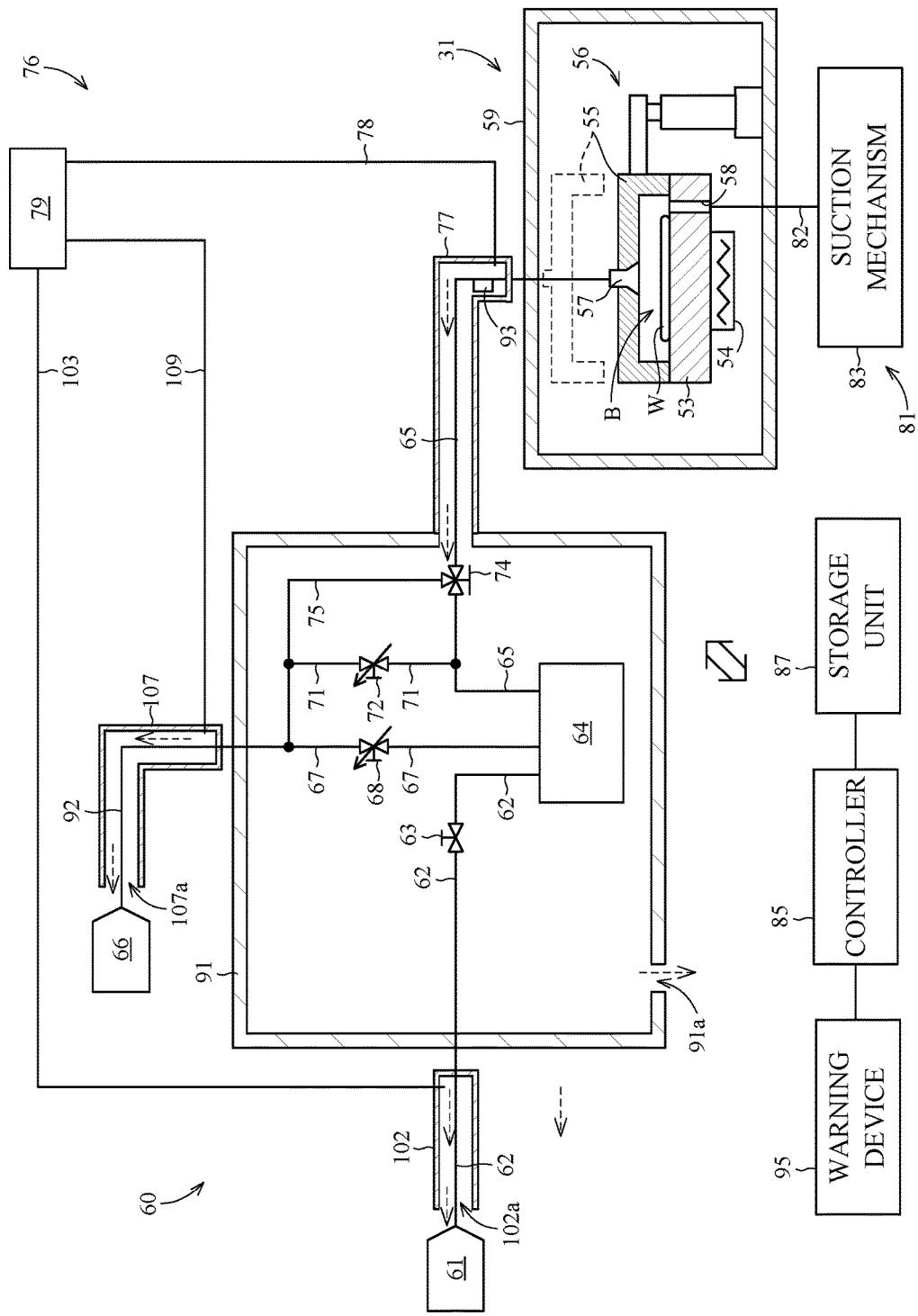
FIG. 16 is a view showing a hydrophobizing unit and components relating thereto according to another modified embodiment.

Reference is made to FIG. 16. FIG. 16 is a view showing a hydrophobizing unit and components relating thereto according to a modified embodiment. The components identical to those of Embodiment 1 are shown with the same signs, and will not particularly be described.

As seen, the hydrophobizing agent supply source 61 is installed outside the cabinet 91. The piping 62 is installed to penetrate the cabinet 91. Part of the piping 62 is installed outside the cabinet 91. The substrate treating apparatus 1 includes a second outer pipe 102 and an introduction pipe 103. The second outer pipe 102 is located outside the part of the piping 62 to receiver the part of the piping 62. The introduction pipe 103 is connected to the air-conditioning control device 79. The introduction pipe 103 is connected near one end of the second outer pipe 102 to supply the temperature control air into the second outer pipe 102. The other end of the second outer pipe 102 is an exhaust port 102a which discharges gas from inside the second outer pipe 102. The one end of the second outer pipe 102 is blocked.

When the introduction pipe 103 introduces the temperature control air into the second outer pipe 102, the introduced temperature control air flows along the outer surface of the piping 62 to be released out of the second outer pipe 102 through the exhaust port 102a. Thus, the temperature control air supplied into the second outer pipe 102 can regulate the temperature of the hydrophobizing agent which provides the basis for the treating gas.

The substrate treating apparatus 1 includes a third outer pipe 107 and an introduction pipe 109. The third outer pipe 107 is located outside the piping 92 and receives part of the piping 92. A portion of the piping 92 installed outside the cabinet 91 is received in the third outer pipe 107. The introduction pipe 109 is connected to the air-conditioning control device 79. The introduction pipe 109 is connected near one end of the third outer pipe 107 to supply the temperature control air into the third outer pipe 107. The other end of the third outer pipe 107 is an exhaust port 107a which discharges gas from inside the third outer pipe 107. The one end of the third outer pipe 107 is blocked.

When the introduction pipe 109 introduces the temperature control air into the third outer pipe 107, the introduced temperature control air flows along the outer surface of the piping 92 to be released out of the third outer pipe 107 through the exhaust port 107a. Thus, the temperature control air supplied into the third outer pipe 107 can regulate the temperature of the inert gas used for producing/attenuating the treating gas.

In this modified embodiment, the first outer pipe 77 does not have the exhaust port 77a. The one end of the first outer pipe 77 is blocked. The introduction pipe 78 is connected near the one end of the first outer pipe 77. The other end of the first outer pipe 77 is connected to the cabinet 91.

When the introduction pipe 78 introduces the temperature control air into the first outer pipe 77, the introduced temperature control air flows along the outer surface of the piping 65 and into the cabinet 91. Thus, the temperature control air supplied into the first outer pipe 77 can regulate the gas temperature of the treating gas.

The piping 92 is an example of the inert gas pipe in this invention. The exhaust port 102a is an example of the second exhaust port in this invention. The exhaust port 107a is an example of the third exhaust port in this invention. The introduction pipes 103 and 109 are examples of the introductory portion in this invention.

(13) In foregoing Embodiment 6, one end of the first outer pipe 77 is the exhaust port 77a. The invention is not limited to this. For example, an exhaust port may be formed near one end of the first outer pipe 77. Or as in the modified embodiment shown in FIG. 16, no exhaust port may be provided at or near one end of the first outer pipe 77.

(14) In foregoing Embodiments 1 and 6, the first outer pipe 77 receives part of the piping 65. The invention is not limited to this. For example, the first outer piping 77 may receive the whole piping 65.

(15) In foregoing Embodiment 6, the controller 85, based on the detection results of the temperature detector 93, gives the alarm, interrupts the supply of the treating gas to the hydrophobizing unit 31, and interrupts the treatment by the hydrophobizing unit 31. However, the invention is not limited to this. For example, based on the detection results of the temperature detector 93, the controller 85 may at least either give the alarm, interrupt the supply of the treating gas, or interrupt the treatment by the hydrophobizing unit 31.

(16) In foregoing Embodiment 6, all of the alarm raising, interruption of the supply of the treating gas, and the interruption of the treatment by the hydrophobizing unit 31 are carried out on the same condition (specifically, the determination made by the controller 85 that the detection result of the temperature detector 93 is not within the reference range). The invention is not limited to this. That is, of the condition for raising the alarm, the condition for interrupting the supply of the treating gas, and the condition for interrupting the treatment by the hydrophobizing unit 31, at least two may be different. For example, a first reference range, a second reference range, and a third reference range may be used for raising the alarm, for interrupting the supply of the treating gas, and for interrupting the treatment by the hydrophobizing unit 31. Here, at least two of the first to third reference ranges shall provide different temperature ranges. More particularly, when the temperature of the treating gas is determined not within the first reference range, the controller 85 may raise the alarm. When the temperature of the treating gas is determined not within the second reference range, the controller 85 may interrupt the supply of the treating gas. When the temperature of the treating gas is determined not within the third reference range, the controller 85 may interrupt the treatment by the hydrophobizing unit 31.

(17) In the foregoing embodiments, the treating gas temperature controller 76 is applied to the treating gas including the hydrophobizing agent. The invention is not limited to this. The treating gas temperature controller 76 may regulate the temperature of a treating gas which does not include the hydrophobizing agent. The treating gas temperature controller 76 is applicable to various treating gases. For example, the treating gas temperature controller 76 may regulate the temperature of treating gases produced by vaporizing treating liquids other than the hydrophobizing agent.

(18) The foregoing embodiments have indicated HMDS as an example of the hydrophobizing agent. This invention is not limited to this. For example, the treating liquid may be a silylation agent such as N-trimethyl silyldimethylamine (TMSDMA) or N-trimethyl silyldiethylamine (TMSDEA). The treating liquid may be a solvent.

(19) Each of the foregoing embodiments and each of the modified embodiments described in paragraphs (1) to (18) above may be further varied as appropriate by replacing or combining their constructions with the constructions of the other modified embodiments.

The characterizing features of the foregoing embodiments will be added hereinafter.

(Note 1) A substrate treating apparatus comprising:
a treating unit for treating a substrate;
a treating gas pipe for supplying a treating gas to the treating unit;
a first outer pipe disposed outside the treating gas pipe for receiving at least part of the treating gas pipe; and
an introductory portion for supplying a temperature-controlled gas into the first outer pipe.

(Note 2) The substrate treating apparatus according to note 1, wherein:
one end of the treating gas pipe is connected to the treating unit; and
one end of the first outer pipe extends along the treating gas pipe to a position adjacent the one end of the treating gas pipe.

(Note 3) The substrate treating apparatus according to note 2, wherein the first outer pipe includes a first exhaust port formed at or adjacent the one end of the first outer pipe for discharging gas from inside the first outer pipe.

(Note 4) The substrate treating apparatus according to note 3, wherein the first outer pipe is connected to the introductory portion, in a position closer to the other end of the first outer pipe than to the first exhaust port.

(Note 5) The substrate treating apparatus according to any one of notes 1 to 4, further comprising:
a vaporizing container connected to the treating gas pipe for producing the treating gas; and
a housing for accommodating the vaporizing container,
wherein the introductory portion further supplies the temperature-controlled gas into the housing.

(Note 6) The substrate treating apparatus according to note 5, wherein:
the treating gas pipe is installed to penetrate the housing;
the first outer pipe is connected to the housing;
an interior of the first outer pipe and an interior of the housing communicate with each other;
the introductory portion allows the temperature-controlled gas to flow from the interior of the first outer pipe to the interior of the housing.

(Note 7) A substrate treating apparatus comprising:
a treating unit for treating a substrate;
a treating gas pipe for supplying a treating gas to the treating unit;
a vaporizing container connected to the treating gas pipe for producing the treating gas;
a housing for accommodating the vaporizing container; and
an introductory portion for supplying a temperature-controlled gas into the housing, (Note 8) The substrate treating apparatus according to any one of notes 5 to 7, wherein at least part of the treating gas pipe is installed inside the housing.

(Note 9) The substrate treating apparatus according to any one of notes 5 to 8, further comprising a treating liquid supply source disposed inside the housing for supplying a treating liquid to the vaporizing container.

(Note 10) The substrate treating apparatus according to any one of notes 5 to 9, wherein the housing has a housing-side exhaust port for discharging gas from inside the housing.

(Note 11) The substrate treating apparatus according to any one of notes 5 to 10, further comprising:
a treating liquid pipe for supplying the treating liquid to the vaporizing container;
wherein at least part of the treating liquid pipe is installed inside the housing.

(Note 12) The substrate treating apparatus according to any one of notes 5 to 11, further comprising:
an inert gas pipe for supplying an inert gas to the vaporizing container;
wherein at least part of the inert gas pipe is installed inside the housing.

(Note 13) The substrate treating apparatus according to any one of notes 1 to 12, further comprising:
a vaporizing container connected to the treating gas pipe for producing the treating gas;
a treating liquid pipe for supplying a treating liquid to the vaporizing container; and
a second outer pipe disposed outside the treating liquid pipe for receiving at least part of the treating liquid pipe;
wherein the introductory portion further supplies the temperature-controlled gas into the second outer pipe.

(Note 14) The substrate treating apparatus according to any one of notes 1 to 13, further comprising:
a vaporizing container connected to the treating gas pipe for producing the treating gas;
an inert gas pipe for supplying an inert gas to the vaporizing container; and
a third outer pipe disposed outside the inert gas pipe for receiving at least part of the inert gas pipe;
wherein the introductory portion further supplies the temperature-controlled gas into the third outer pipe.

(Note 15) The substrate treating apparatus according to any one of notes 1 to 14, further comprising:
a temperature detector for detecting a temperature of the treating gas; and
a controller for monitoring the temperature of the treating gas based on detection results of the temperature detector.

(Note 16) The substrate treating apparatus according to note 15, wherein the controller, based on the detection results of the temperature detector, carries out at least one of raising of an alarm, interruption to supply of the treating gas, and interruption to treatment by the treating unit.

(Note 17) The substrate treating apparatus according to note 15 or 16, wherein the controller checks whether the temperature detected by the temperature detector is within a reference range set beforehand.

(Note 18) The substrate treating apparatus according to any one of notes 1 to 17, wherein:
the treating unit is a hydrophobizing unit; and
the treating liquid is a hydrophobizing agent.

This invention may be embodied in other specific forms without departing from the spirit or essential attributes thereof and, accordingly, reference should be made to the appended claims, rather than to the foregoing specification, as indicating the scope of the invention.

What is claimed is:

1. A substrate treating method comprising:
a determining step of determining a hydrophobic treatment condition adapted for hydrophobizing a surface of a substrate, from a target dissolved area size in a resist pattern, and from information which provides a relationship between the target dissolved area size and the treating condition; and
a hydrophobic treatment step of hydrophobizing the surface of the substrate using the hydrophobic treatment condition determined in the determining step, the hydrophobic treatment step being performed before forming resist film on the surface of the substrate;
wherein the target is at least one of a target value of the dissolved area size and an amount of adjustment to a reference value of the dissolved area size; and
the dissolved area size is at least one of a size of spaces of the dissolved area, a size of holes of the dissolved area, and a distance between dots of the dissolved area of said resist pattern.

2. The substrate treating method according to claim 1, wherein the treatment condition changes a contact angle on the surface of the substrate.

3. The substrate treating method according to claim 1, wherein:
the larger the dissolved area size that the target provides, the larger the contact angle that is provided by the treatment condition determined in the determining step.

4. The substrate treating method according to claim 1, wherein:
the treatment condition includes a gas concentration of a treating gas used in the hydrophobic treatment step; and
the larger the dissolved area size that the target provides, the higher the gas concentration that is provided by the treatment condition determined in the determining step.

5. The substrate treating method according to claim 1, wherein:
the treatment condition includes a retention time for keeping a state where the surface of the substrate is covered with a treating gas, without blowing the treating gas out to the substrate; and
the larger the dissolved area size that the target provides, the longer the retention time that is provided by the treatment condition determined in the determining step.

6. The substrate treating method according to claim 1, wherein:
the treatment condition includes a gas temperature of a treating gas used in the hydrophobic treatment step; and
the larger the dissolved area size that the target provides, the higher the gas temperature that is provided by the treatment condition determined in the determining step.

7. The substrate treating method according to claim 1, wherein:
the treatment condition is at least one of
a gas concentration of a treating gas used in the treating hydrophobic treatment step;
a gas temperature of the treating gas;
a gas flow rate of the treating gas blown out to the substrate;
a blowout time for blowing the treating gas out to the substrate;
a retention time for keeping a state where the surface of the substrate is covered with the treating gas, without blowing the treating gas out to the substrate;
a treating time for hydrophobizing the surface of the substrate; and
a temperature of the substrate.

8. The substrate treating method according to claim 1, wherein the determining step determines at least two types of the treatment condition based on the target.

9. The substrate treating method according to claim 1, wherein the information includes:
first information which provides a relationship between the dissolved area size and a contact angle on the surface of the substrate; and
second information which provides a relationship between the contact angle and the treatment condition.

10. The substrate treating method according to claim 1, wherein:
the treatment condition includes:
a first treatment condition; and
a second treatment condition; and
the information provides a relationship between the dissolved area size and a combination of the first treatment condition and the second treatment condition.

11. The substrate treating method according to claim 1, wherein:
the hydrophobic treatment step includes:
a blowout step for regulating a gas concentration of a treating gas by attenuating the treating gas with an inert gas, and blowing the treating gas having the gas concentration regulated, out to the surface of the substrate; and
a retaining step for keeping a state where the surface of the substrate is covered with the treating gas, without blowing the treating gas out to the substrate.

12. The substrate treating method according to claim 11, wherein the blowout step regulates a gas temperature of the treating gas.

13. The substrate treating method according to claim 1, further comprising a prior blowout step for discarding the treating gas;
wherein the treatment condition specifies a feature of the treating gas to be used in the hydrophobic treatment step;
the prior blowout step being executed when the treating gas condition has been changed in the determining step.

14. The substrate treating method according to claim 1, wherein the resist pattern is formed on the resist film and the resist film has a thickness of at least 2 μm.

15. The substrate treating method according to claim 1, further comprising:
a resist film forming step for forming the resist film on the surface of the substrate hydrophobized; and
a developing step for supplying a developer to the resist film on the surface of the substrate.

* * * * *